(12) United States Patent
Nishii et al.

(10) Patent No.: US 9,503,049 B2
(45) Date of Patent: Nov. 22, 2016

(54) ACOUSTIC WAVE ELEMENT AND ACOUSTIC WAVE DEVICE USING SAME

(75) Inventors: Junya Nishii, Inazawa (JP); Tetsuya Kishino, Nara (JP);
(Continued)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 627 days.

(21) Appl. No.: 13/878,116

(22) PCT Filed: Dec. 22, 2011

(86) PCT No.: PCT/JP2011/079865
§ 371 (c)(1),
(2), (4) Date: Apr. 5, 2013

(87) PCT Pub. No.: WO2012/090873
PCT Pub. Date: Jul. 5, 2012

(65) Prior Publication Data
US 2013/0207747 A1    Aug. 15, 2013

(30) Foreign Application Priority Data

Dec. 28, 2010    (JP) .................................. 2010-294051
May 31, 2011    (JP) .................................. 2011-121628

(51) Int. Cl.
*H03H 9/25*  (2006.01)
*H03H 9/145* (2006.01)
*H03H 9/64*  (2006.01)

(52) U.S. Cl.
CPC ........... *H03H 9/25* (2013.01); *H03H 9/14541* (2013.01); *H03H 9/6406* (2013.01)

(58) Field of Classification Search
CPC ................................ H03H 3/08; G01N 29/022
(Continued)

(56) References Cited

U.S. PATENT DOCUMENTS 4,489,250 A * 12/1984 Ebata et al. .............. 310/313 A
4,617,487 A * 10/1986 Sone et al. ................ 310/313 D
(Continued)

FOREIGN PATENT DOCUMENTS

JP    S53-139951 A    12/1978
JP    08-204493    *    8/1996 ............. H03H 9/145
(Continued)

OTHER PUBLICATIONS

International Search Report dated Mar. 6, 2012, issued for International Application No. PCT/US2011/079865.

*Primary Examiner* — Thomas Dougherty
(74) *Attorney, Agent, or Firm* — Procopio Cory Hargreaves and Savitch LLP

(57) ABSTRACT

A SAW element has a substrate; an IDT electrode located on an upper surface of the substrate and comprises Al or an alloy containing Al; a first film located on an upper surface of the IDT electrode; and a protective layer which covers the IDT electrode provided with the first film and the portion of the substrate exposed from the IDT electrode, which has a thickness from the upper surface of the substrate larger than a total thickness of the IDT electrode and first film, and which contains a silicon oxide. The first film contains a material which has a larger acoustic impedance than the material (Al or the alloy containing Al) of the IDT electrode and the silicon oxide and which has a slower propagation velocity of an acoustic wave than the material of the IDT electrode and the silicon oxide.

11 Claims, 18 Drawing Sheets

(75) Inventors: Hiroyuki Tanaka, Kyoto (JP); Kyohei Kobayashi, Otsu (JP); Kenji Yamamoto, Kizugawa (JP); Masahisa Shimozono, Higashiosaka (JP); Takanori Ikuta, Kyoto (JP); Michiaki Nishimura, Kirishima (JP)

(58) Field of Classification Search
USPC .............................. 310/313 A–313 D, 313 R
See application file for complete search history.

(56) References Cited

U.S. PATENT DOCUMENTS

| 7,332,986 | B2* | 2/2008 | Koga et al. .................. 333/193 |
| 2004/0070313 | A1* | 4/2004 | Furukawa et al. ........ 310/313 R |
| 2006/0175639 | A1* | 8/2006 | Leidl et al. .................. 257/245 |
| 2008/0012450 | A1 | 1/2008 | Meister et al. |
| 2008/0252396 | A1 | 10/2008 | Ruile et al. |
| 2008/0266024 | A1 | 10/2008 | Ruile et al. |
| 2009/0009028 | A1 | 1/2009 | Nishiyama et al. |
| 2009/0121584 | A1* | 5/2009 | Nishimura et al. ....... 310/313 B |
| 2009/0174285 | A1 | 7/2009 | Kando |
| 2009/0295507 | A1 | 12/2009 | Kando et al. |
| 2010/0277036 | A1* | 11/2010 | Shimizu et al. .......... 310/313 B |
| 2010/0287623 | A1 | 11/2010 | Banik et al. |
| 2012/0019101 | A1* | 1/2012 | Nakahashi ................ 310/313 C |

FOREIGN PATENT DOCUMENTS

| JP | H8-204493 A | 8/1996 |
| JP | 2004-112748 A | 4/2004 |
| JP | 2005-065050 A | 3/2005 |
| JP | 2008-522514 A | 6/2008 |
| JP | 2009-516968 A | 4/2009 |
| JP | 2009-290472 A | 12/2009 |
| WO | 2007/125734 A1 | 11/2007 |
| WO | 2008/038506 A1 | 4/2008 |
| WO | 2008/126614 A1 | 10/2008 |

\* cited by examiner

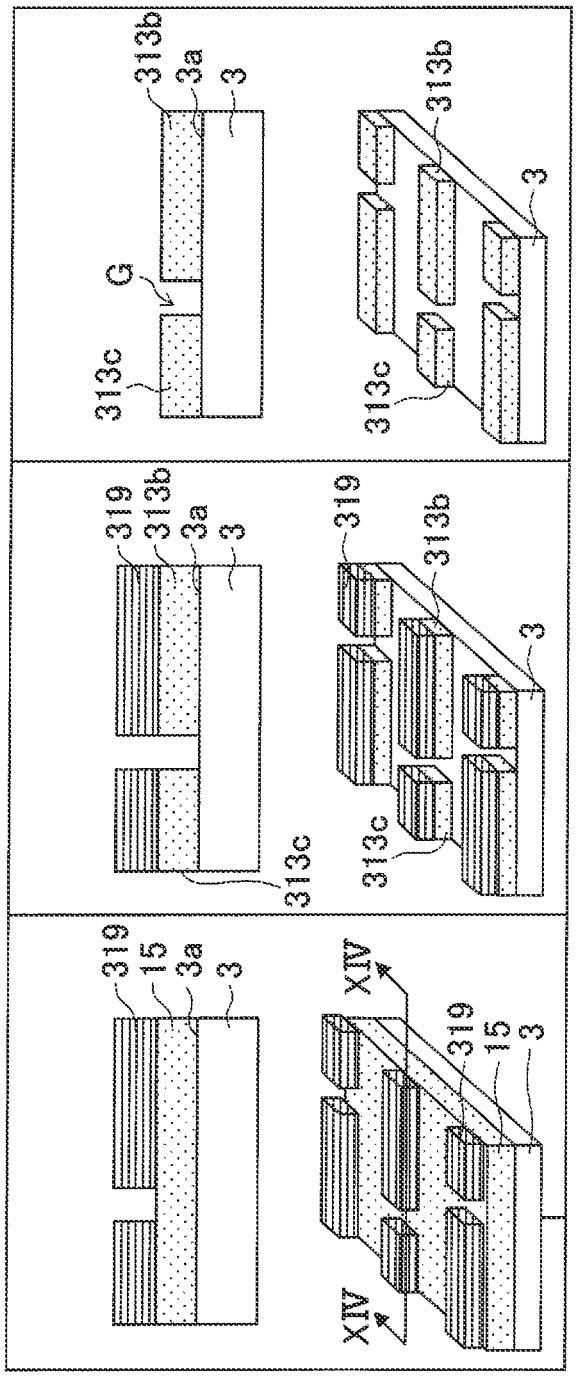

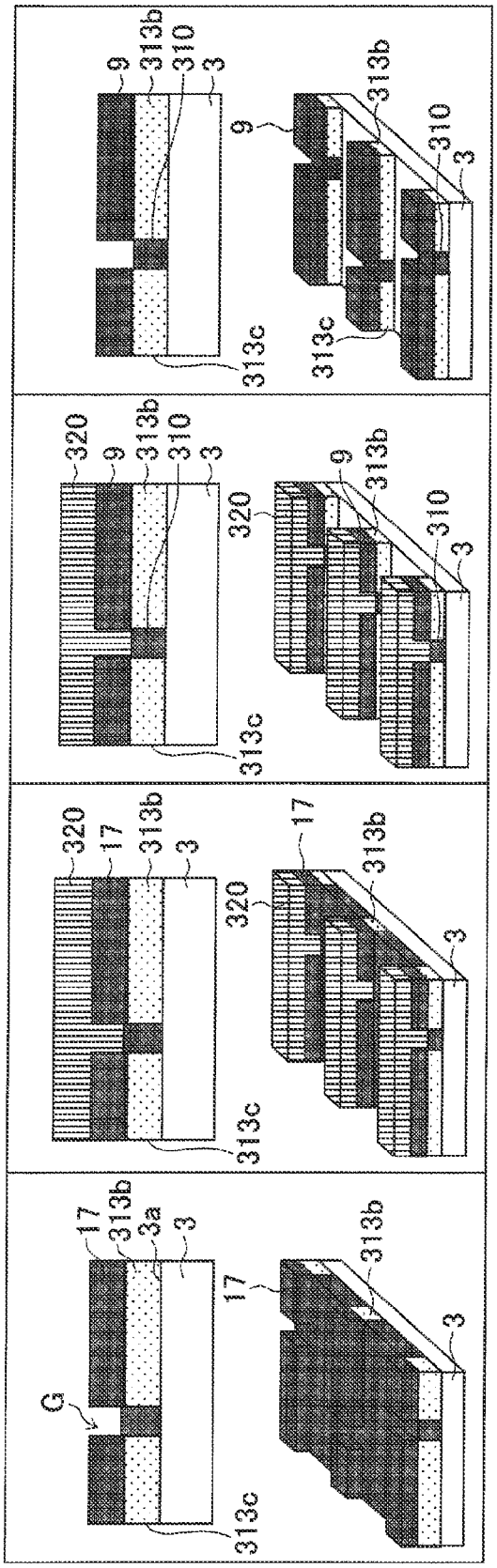

ACOUSTIC WAVE ELEMENT AND ACOUSTIC WAVE DEVICE USING SAME

TECHNICAL FIELD

The present invention relates to an acoustic wave element such as surface acoustic wave (SAW) element or the like, and an acoustic wave device using the same.

BACKGROUND ART

Known in the art is an acoustic wave element which has a piezoelectric substrate, an IDT (interdigital transducer) electrode (excitation electrode) which is provided on a main surface of the piezoelectric substrate, and a protective layer which covers the IDT electrode (for example, Patent Literature 1 or 2). The protective layer is formed by for example $SiO_2$ and contributes to suppression of corrosion of the IDT electrode, compensation for the change of characteristics of the IDT electrode against temperature, and so on.

Patent Literature 1 points out that in an acoustic wave element which has a protective layer ($SiO_2$ film) such as described above, when the IDT electrode is formed by Al or an alloy which contains Al as a major component, a sufficient reflection coefficient cannot be obtained (paragraph 0009). Further, it proposes to form the IDT electrode by a metal which has a larger density than Al or an alloy which contains this metal as a major component so as to obtain a relatively high reflection coefficient (claim 1 etc.)

Note that, while not matter relating to the reflection coefficient, Patent Literature 1 and 2 propose to improve the adhesion between the IDT electrode and the $SiO_2$ film by forming an adhesion layer between them (Patent Literature 1, paragraph 0011 and Patent literature 2, paragraph 0107). In Patent Literature 1 and 2, the adhesion layer is formed thin so as not to exert an influence upon propagation of the SAW. Specifically, the adhesion layer is made 50 to 100 Å (Patent Literature 1, paragraph 0009) or not more than 1% of the wavelength of the SAW (Patent literature 2, paragraph 0108).

As explained above, Patent Literature 2 proposes to form the IDT electrode by a material which has a higher density than Al. However, from the viewpoints of the electrical characteristics, ease of working, cost of material, etc., use of Al or an alloy which contains Al as a major component as the material of the IDT electrode is sometimes desired. In other words, it is sometimes desired to reduce the restrictions on the material for forming the IDT electrode to thereby improve the degree of freedom in selection of the material. Accordingly, as a method different from that in Patent Literature 2, provision of a method of raising the reflection coefficient is desired.

CITATIONS LIST

Patent Literature

Patent Literature 1: Japanese Patent Publication No. 08-204493A

Patent Literature 2: Japanese Patent Publication No. 2004-112748A

SUMMARY OF INVENTION

An acoustic wave element according to an embodiment of the present invention has a piezoelectric substrate; an electrode which is located on an upper surface of the piezoelectric substrate and which contains Al as a major component; a first film which is located on an upper surface of the electrode; and an insulation layer which covers the first film and the portion of the piezoelectric substrate which is exposed from the electrode, which has a thickness from the upper surface of the piezoelectric substrate which is larger than a total thickness of the electrode and first film, and which contains a silicon oxide as a major component, wherein the first film contains as a major component a material which has a larger acoustic impedance than the material of the electrode and the material of the insulation layer and which has a slower propagation velocity of an acoustic wave than the material of the electrode and the material of the insulation layer.

An acoustic wave device according to an embodiment of the present invention has the above acoustic wave element and a circuit board to which the acoustic wave element is attached.

Advantageous Effects of Invention

According to the above configurations, by arranging, on the upper surface of the electrode, the first film which has a larger acoustic impedance than the material of the electrode and silicon oxide and which has a slower propagation velocity of an acoustic wave than the material of the electrode and silicon oxide, the reflection coefficient of the acoustic wave element in which the electrode is covered by silicon oxide can be made high and thus an acoustic wave element excellent in temperature compensation characteristic and in resonance characteristic can be obtained.

BRIEF DESCRIPTION OF DRAWINGS

FIG. 1A is a plan view of a SAW element according to a first embodiment of the present invention, while

FIG. 14(a) to FIG. 14G are diagrams for explaining a method of production of the SAW element in FIG. 13.

DESCRIPTION OF EMBODIMENTS

Below, SAW elements and SAW devices according to embodiments of the present invention are explained with reference to the drawings. Note that the drawings used in the following explanation are schematic ones and that dimensions, ratios, etc. of the drawings do not always coincide with the actual ones. Further, in the second and following embodiments, configurations which are same as or resembled the configuration of the first embodiment are assigned the same notations as those in the first embodiment, and the explanations will be sometimes omitted.

First Embodiment

Configuration and Method of Production of SAW Element

Figure 1A:
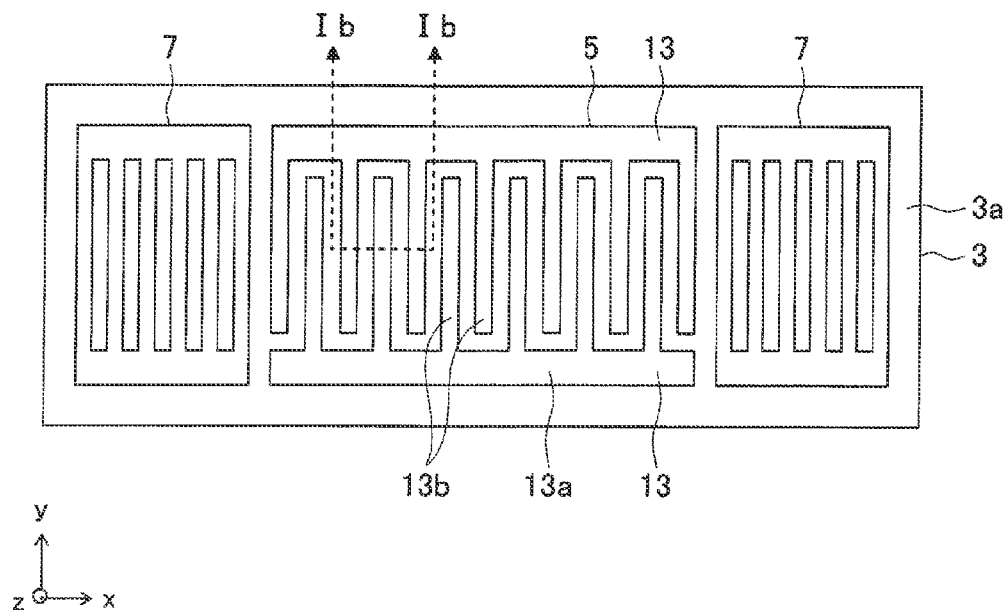
Figure 1B:
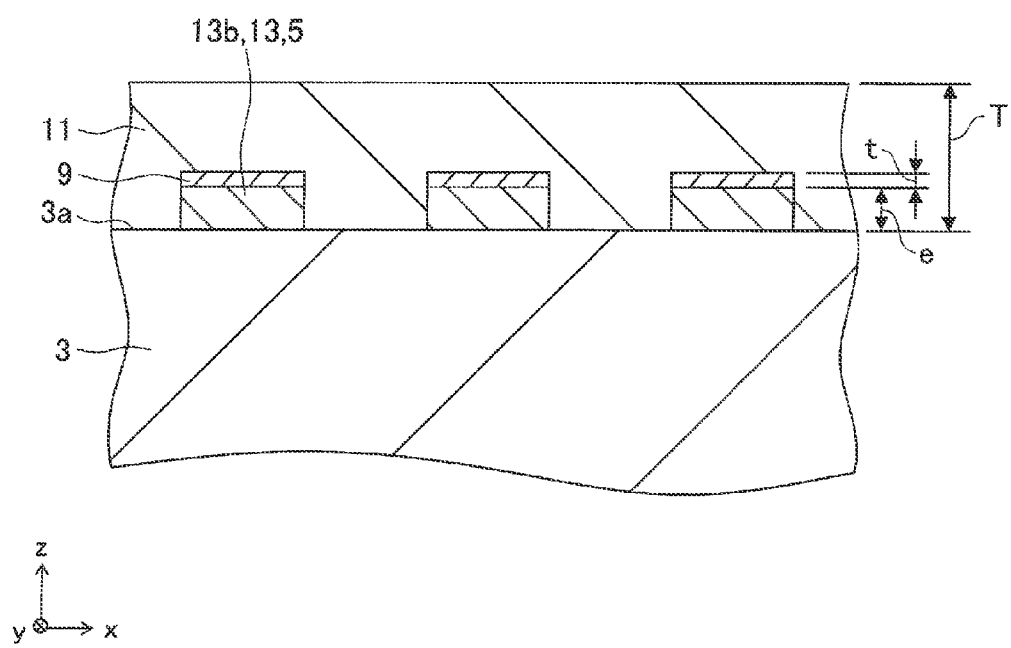
FIG. 1B is a cross-sectional view taken along a line Ib-Ib in FIG. 1A.

FIG. 1A is a plan view of a SAW element 1 according to a first embodiment of the present invention, and FIG. 1B is a cross-sectional view taken along a line Ib-Ib in FIG. 1A. Note that, in the SAW element 1, any direction may be upward or downward. However, in the following description, for convenience, a Cartesian coordinate system xyz is defined, the positive side of the z-direction (the front side from the surface of the paper in FIG. 1A and the upper side in the surface of the paper in FIG. 1B) is defined as the upper side, and the terms "upper surface", "lower surface", etc. are used based on this.

The SAW element 1 has a substrate 3, an IDT electrode 5 and reflectors 7 which are provided at an upper surface 3a of the substrate 3, a first film 9 (FIG. 1B) which is provided on the IDT electrode 5 and reflectors 7, and a protective layer 11 (FIG. 1B) which covers the upper surface 3a from the upper side of the first film 9. Note that, other than these, the SAW element 1 may have lines for inputting and outputting signals to and from the IDT electrode 5 and so on.

The substrate 3 is configured by a piezoelectric substrate. Specifically, for example, the substrate 3 is configured by a substrate of single crystal having piezoelectricity such as a lithium tantalate (LiTaO$_3$) single crystal or lithium niobate (LiNbO$_3$) single crystal or the like. More preferably, the substrate 3 is configured by a 128°±10° Y-X cut LiNbO$_3$ substrate. The planar shape and various dimensions of the substrate 3 may be suitably set. As an example, the thickness of the substrate 3 (z-direction) is 0.2 mm to 0.5 mm.

The IDT electrode 5 has a pair of comb-shaped electrodes 13. Each comb-shaped electrode 13 has a bus bar 13a (FIG. 1A) which extends in the propagation direction of the SAW (x-direction) and a plurality of electrode fingers 13b which extend from the bus bar 13a in a direction perpendicular to the propagation direction (y-direction). The two comb-shaped electrodes 13 are provided so as to mesh with each other (so that the electrode fingers 13b cross each other). The plurality of electrode fingers 13b are provided so that their pitch becomes equivalent to for example a half wavelength of the wavelength λ of the SAW at a frequency to be resonated.

Note that, FIG. 1 etc. are schematic views. In actuality, a plurality of pairs of comb-shaped electrodes having a larger number of electrode fingers than this may be provided. Further, a ladder type SAW filter in which a plurality of IDT electrodes 5 are connected by serial connection, parallel connection, or another method may be configured, or a dual mode SAW resonator filter in which a plurality of IDT electrodes are arranged along the X direction etc. may be configured. Further, by making the lengths of the plurality of electrode fingers different, weighting by apodizing may be carried out as well. A dummy electrode may be provided as in the second embodiment etc. explained later.

The IDT electrode 5 is formed by for example a material which contains Al as a major component (including an Al alloy). The Al alloy is for example an Al—Cu alloy. Note that, the term "which contains Al as a major component" means that Al is basically used as the material, but also a material in which are mixed impurities etc. other than Al which may be naturally mixed in during a manufacturing process etc. of the SAW device 1 is included. Below, the same is true for the case of using the expression "major component". Various dimensions of the IDT electrode 5 are suitably set in accordance with the electrical characteristic etc. demanded from the SAW element 1. As an example, a thickness "e" (FIG. 1B) of the IDT electrode 5 is 100 nm to 300 nm.

Note that, the IDT electrode 5 may be directly arranged upon the upper surface 3a of the substrate 3 or may be arranged on the upper surface 3a of the substrate 3 with another member interposed therebetween. The "other member" is for example Ti, Cr, or an alloy of the same. When the IDT electrode 5 is arranged on the upper surface 3a of the piezoelectric substrate 3 with another member interposed therebetween in this way, the thickness of the other member is set to a thickness of an extent where almost no influence is exerted upon the electrical characteristic of the IDT electrode 5 (for example a thickness of 5% based on the thickness of the IDT electrode 5 in the case of Ti).

The reflector 7 is formed in a lattice shape which has a substantially equal pitch to the pitch of the electrode fingers 13b of the IDT electrode 5. The reflector 7 is for example formed by the same material as that of the IDT electrode 5 and is formed to a thickness equivalent to the IDT electrode 5.

The first film 9 is for raising the reflection coefficients of the IDT electrode 5 and the reflectors 7. The first film 9 is for example provided over the entire surface of the upper surfaces of the IDT electrode 5 and the reflectors 7. The first film 9 is configured by a material which contains as a major component a material which has a different acoustic impedance from the material which configures the IDT electrode 5 and the reflectors 7 (Al or Al alloy) and the material which configures the protective layer (explained later). The difference of the acoustic impedance is preferably a certain extent or more. For example, it is 15 MRayl or more, more preferably 20 MRayl or more. The preferred material of the first film 9 and the preferred thickness "t" (FIG. 1B) of the first film 9 are explained later.

The protective layer 11 is for example provided substantially over the entire surface of the upper surface 3a of the substrate 3, covers the IDT electrode 9 and the reflectors 7 which are provided with the first film 9, and covers the portion of the upper surface 3a which is exposed from the IDT electrode 5 and the reflectors 7. The thickness T (FIG. 1B) of the protective layer 11 from the upper surface 3a is set larger than the thickness "e" of the IDT electrode 5 and the reflectors 7. For example, the thickness T is thicker than the thickness "e" by 100 nm or more and is 200 nm to 700 nm.

The protective layer 11 is made of a material which contains as a major component a material which has an insulation property. Further, the protective layer 11 is formed by a material which contains as a major component a material in which the propagation velocity of the acoustic wave becomes fast when the temperature rises such as $SiO_2$ or the like. The change of the characteristics due to a change of the temperature can be kept small by this. That is, an acoustic wave element which is excellent in temperature compensation can be obtained. Note that, general materials such as the material which configures the substrate 3 or the like become slow in propagation velocity of the acoustic wave when the temperature rises.

Further, the surface of the protective layer 11 is desirably made free from large relief shapes. The propagation velocity of the acoustic wave which propagates on the piezoelectric substrate changes when influenced by relief shapes on the surface of the protective layer 11. Therefore, if large relief shapes exist on the surface of the protective layer 11, a large variation arises in the resonant frequency of the acoustic wave elements which are produced. Accordingly, if making the surface of the protective layer 11 flat, the resonant frequency of the acoustic wave elements is stabilized. Specifically, desirably the flatness of the surface of the protective layer 11 is made 1% or less of on the wavelength of the acoustic wave which propagates on the piezoelectric substrate.

FIG. 2A to FIG. 2E are cross-sectional views which correspond to FIG. 1B for explaining the method of production of the SAW element 1. The manufacturing process advances from FIG. 2A to FIG. 2E in order. Note that, the various types of layers change in shape etc. along the advance of the process. However, common notations are sometimes used before and after the change.

Figure 2A:
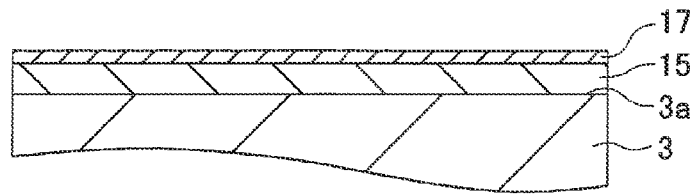
FIG. 2A to FIG. 2E are cross-sectional views corresponding to FIG. 1B for explaining a method of production of the SAW element according to the first embodiment.

As shown in FIG. 2A, first, on the upper surface 3a of the substrate 3, a conductive layer 15 which becomes the IDT electrode 5 and the reflectors 7 and an additional layer 17 which becomes the first film 9 are formed. Specifically, first, by a thin film forming method such as a sputtering process, vapor deposition process, CVD (chemical vapor deposition) process or the like, the conductive layer 15 is formed on the upper surface 3a. Next, by the same thin film forming method, the additional layer 17 is formed.

Figure 2B:
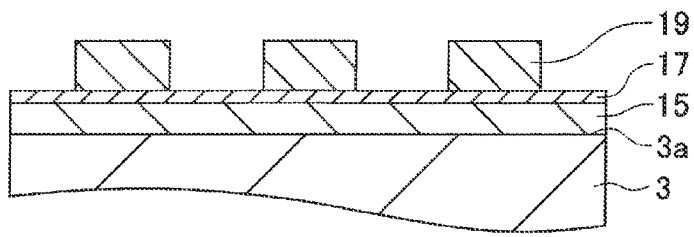

When the additional layer 17 is formed, as shown in FIG. 2B, a resist layer 19 is formed as a mask for etching the additional layer 17 and conductive layer 15. Specifically a thin film of a negative type or positive type photosensitive resin is formed by a suitable thin film forming method, then the portions of the thin film at positions where the IDT electrode 5 and reflectors 7 etc. are not arranged are removed by a photolithography method or the like.

Figure 2C:
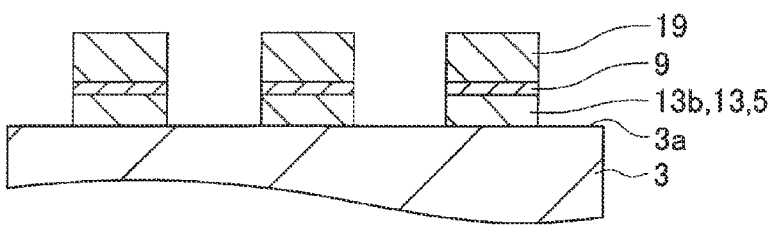
Figure 2D:
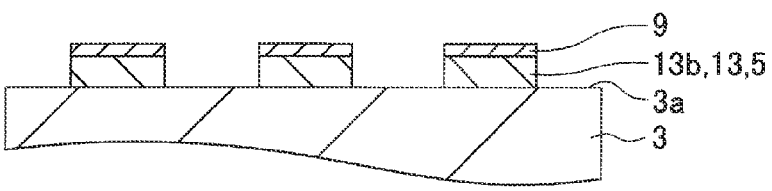

Next, as shown in FIG. 2C, the additional layer 17 and conductive layer 15 are etched by a suitable etching method such as a RIE (reactive ion etching) or the like. Therefore, the IDT electrode 5 and the reflectors 7 which are provided with the first film 9 are formed. After that, as shown in FIG. 2D, the resist layer 19a is removed by using suitable chemical solution.

Figure 2E:
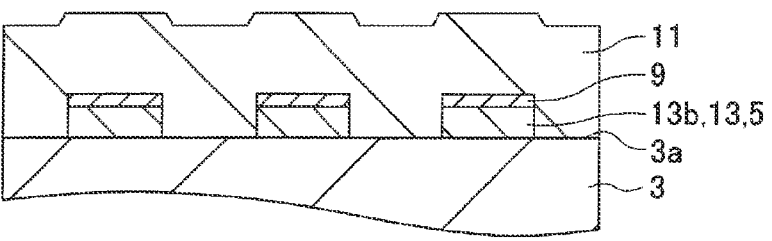

Then, as shown in FIG. 2E, a thin film which becomes the protective layer 11a is formed by a suitable thin film forming method such as a sputtering process, CVD process or the like. At this point of time, relief is formed on the surface of the thin film which becomes the protective layer 11 due to thicknesses of the IDT electrode 5 etc. Then, according to need, the surface is flattened by chemical mechanical polishing or the like, whereby the protective layer 11 is formed as shown in FIG. 1B. Note that, in the protective layer 11, before or after flattening, portions may be removed by photolithography or the like in order to expose pads 39 (FIG. 12) etc. explained later.

Figure 3A:
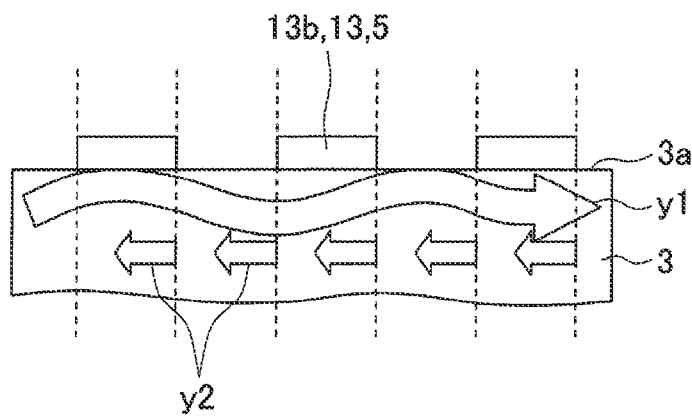
FIG. 3A to FIG. 3C are diagrams for explaining the modes of operation of SAW elements of comparative examples and the first embodiment.
Figure 3B:
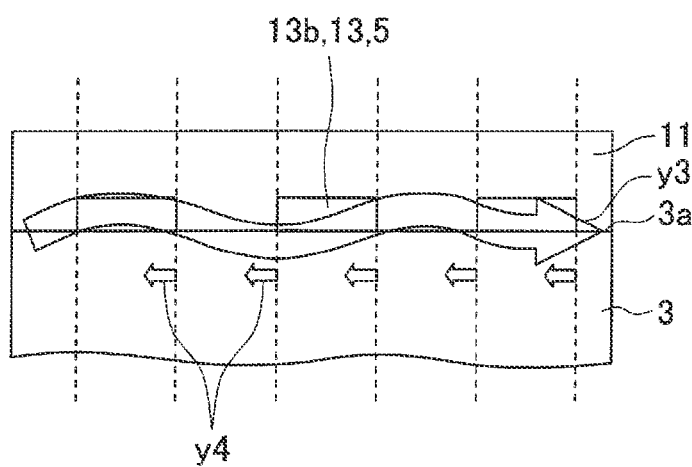
Figure 3C:
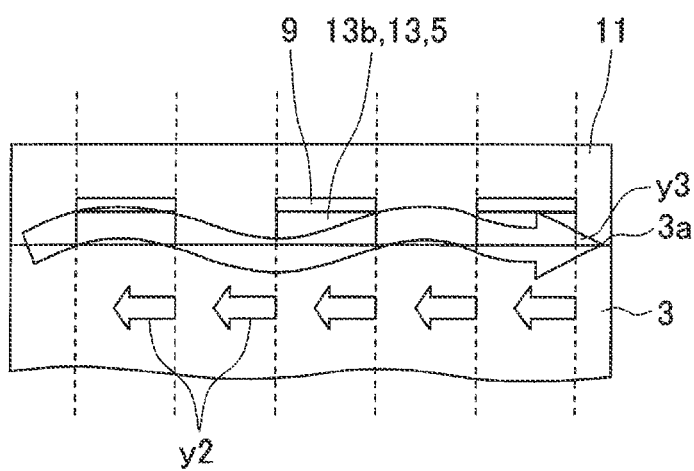

Referring to FIG. 3A to FIG. 3C, the modes of operation of comparative examples are explained, and the mode of operation of the SAW element 1 of the first embodiment is explained.

FIG. 3A is a cross-sectional view for explaining the mode of operation of a SAW element 101 of a first comparative example. The SAW element 101 is comprised of the SAW element 1 of the first embodiment in a state with no first film 9 and protective layer 11.

When voltage is supplied to the substrate 3 by the IDT electrode 5, as indicated by an arrow y1, near the upper surface 3a of the substrate 3, a SAW is induced which propagates along the upper surface 3a. Further, as indicated by an arrow y2, the SAW is reflected at a boundary between the electrode finger 13b and a gap portion between electrode fingers (region between the electrode fingers 13b which cross each other, i.e., non-arrangement region of the electrode fingers 13b). Then, a standing wave which has the pitch of the electrode fingers 13b as a half wavelength is formed by the SAW indicated by the arrows y1 and y2. The standing wave is converted to an electrical signal having the same frequency as the standing wave and is taken out by the electrode fingers 13b. In this way, the SAW element 1 functions as a resonator or filter.

In the SAW element 101, however, when its temperature rises, the propagation velocity of the acoustic wave on the substrate 3 becomes slow, and the gap portion between electrode fingers becomes large. As a result, the resonant frequency becomes low, so the desired characteristics are liable to not be obtained.

FIG. 3B is a cross-sectional view for explaining the mode of operation of a SAW element 201 of a second comparative example. The SAW element 201 is comprised of the SAW element 1 of the first embodiment in a state with no first film 9. In other words, it is comprised of the SAW element 101 of the first comparative example to which the protective layer 11 is added.

In the SAW element 201, the protective layer 11 is provided. Therefore, as indicated by an arrow y3, the induced SAW is propagated not only on the substrate 3, but also on the protective layer 11. Here, as explained above, the protective layer 11 is formed by a material by which the propagation velocity of the acoustic wave becomes fast when the temperature rises, for example silicon oxide such as $SiO_2$ or the like. Accordingly, in the SAW propagating on the substrate 3 and the protective layer 11 as a whole, the change of the velocity due to the temperature rise is suppressed. That is, by the protective layer 11, the change in characteristics of the substrate 3 due to a temperature rise is compensated for.

However, in a case where the IDT electrode 5 is formed by Al or an Al alloy and the protective layer 11 is formed by $SiO_2$, the acoustic properties of the IDT electrode 5 and the protective layer 11 become similar, so the boundary between the electrode finger 13b and the gap portion between electrode fingers becomes vague acoustically. In other words, the reflection coefficient at the boundary between the electrode finger 13b and the gap portion between electrode fingers falls. As a result, as indicated by an arrow y4 in FIG. 3B which is smaller than the arrow y2 in FIG. 3A, the reflection wave of the SAW is not sufficiently obtained, so the desired characteristics are liable to not be obtained.

FIG. 3C is a cross-sectional view for explaining the mode of operation of a SAW element 1 of a first embodiment.

The SAW element 1 has the protective layer 11. Therefore, in the same way as the SAW element 201 of the second comparative example, an effect of compensation for the temperature characteristic is obtained. Further, the SAW element 1 has the first film 9, and the first film 9 is formed by a material having an acoustic impedance which is different from the acoustic impedances of the IDT electrode 5 and protective layer 11 to a certain extent. Accordingly, the reflection coefficient at the boundary position between the electrode finger 13b and the gap portion between electrode fingers becomes high. As a result, as indicated by the arrow y2, it becomes possible to obtain a sufficient reflection wave of SAW.

(Preferred Material and Thickness of First Film)

Below, the preferred material and thickness "t" of the first film 9 are studied. Note that, in the following study, so long not indicated to the contrary, it is assumed that the substrate 3 is a 128° Y-X cut $LiNbO_2$ substrate, the IDT electrode 5 is made of Al, and the protective layer 11 is made of $SiO_2$.

Figure 4A:
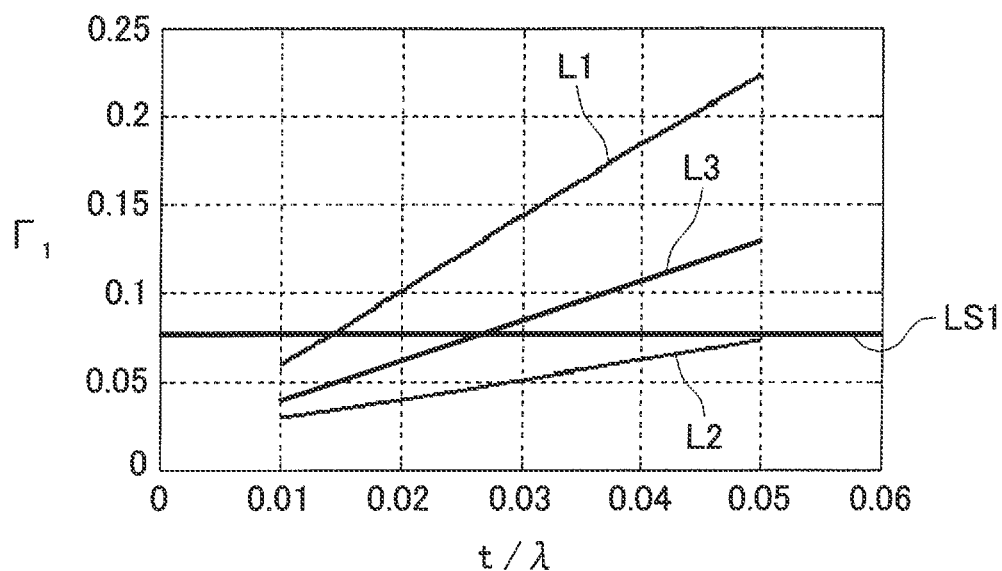
FIG. 4A and FIG. 4B are graphs which show a reflection coefficient $\Gamma_1$ per electrode finger and electromechanical coupling factor $K^2$.
Figure 4B:
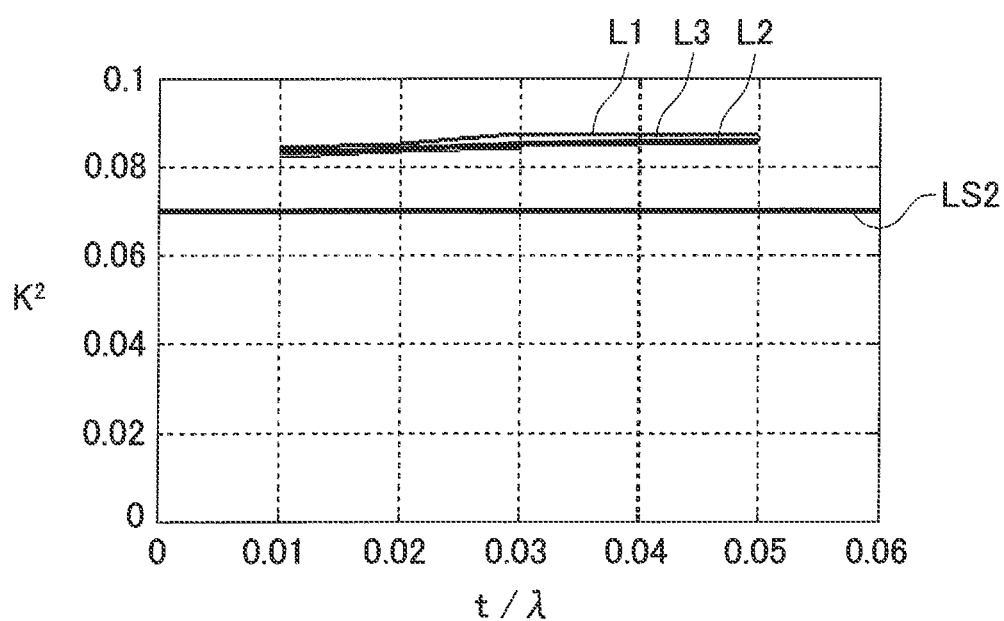

FIG. 4A and FIG. 4B are graphs which shows a reflection coefficient $\Gamma_2$ per electrode finger 13b and electromechanical coupling factor $K^2$.

FIG. 4A and FIG. 4B was obtained by simulation calculation. The calculation conditions are as follows. Note that, the various dimensions are shown by ratios based on the wavelength λ of the SAW.

Normalized thickness e/λ of IDT electrode 5: 0.08
Normalized thickness T/λ of protective layer 11: 0.25
Normalized thickness t/λ of first film 9: Changed within a range of 0.01 to 0.05.
Material of first film 9: WC, TiN, $TaSi_2$
Acoustic impedances of materials (unit: MRayl):

| $SiO_2$: 12.2 | Al: 13.5 | |
| WC: 102.5 | TiN: 56.0 | $TaSi_2$: 40.6 |

In FIG. 4A and FIG. 4B, the abscissa shows the normalized thickness t/λ of the first film 9. In FIG. 4A, the ordinate shows the reflection coefficient $\Gamma_2$ per electrode finger 13b. In FIG. 4B, the ordinate shows the electromechanical coupling factor $K^2$.

In FIG. 4A and FIG. 4B, lines L1, L2, and L3 respectively correspond to the cases where the first film 9 is made of WC, TiN, and $TaSi_2$. In FIG. 4A, a line LS1 shows the lower limit of the generally preferred range of the reflection coefficient $\Gamma_1$. In FIG. 4B, a line LS2 shows the lower limit of the generally preferred range of the electromechanical coupling factor $K^2$.

It was confirmed from these diagrams that, by provision of the first film 9, it was possible to contain the reflection coefficient $\Gamma_2$ in the generally preferred range while keeping the electromechanical coupling factor $K^2$ in the generally preferred range.

Further, it is suggested from FIG. 4A that the larger the normalized thickness t/λ of the first film 9, the higher the reflection coefficient $\Gamma_1$. It is suggested from FIG. 4B that the normalized thickness t/λ of the first film 9 exerts almost no influence upon the electromechanical coupling factor $K^2$. Note, when the normalized thickness t/λ of the first film 9 becomes large, the electromechanical coupling factor $K^2$ is improved a little. Such a tendency occurs when the first film 9 is formed by any material.

In general, the larger the difference of acoustic impedance between media through which a sound wave is propagated, the larger the reflection wave. However, with $TaSi_2$ (line L3), compared with TiN (line L2), irrespective of the fact that the acoustic impedance is small and the difference of the acoustic impedance from $SiO_2$ is small, the reflection coefficient $\Gamma_1$ becomes large. Below, the reason for this is studied.

The reflection coefficient $\Gamma_1$ and the electromechanical coupling factor $K^2$ were calculated for cases where the first film 9 was formed by various hypothetical materials having acoustic impedances $Z_S$ which were the same as each other but having Young's moduluses E and densities ρ which were different from each other (Case No. 1 to No. 7).

The calculation conditions are as follows.
Normalized thickness e/λ of IDT electrode 5: 0.08
Normalized thickness T/λ of protective layer 11: 0.30
Normalized thickness t/λ of first film 9: 0.03
Physical properties of first film:

| | Zs (MRayl) | E (GPa) | ρ ($10^3$ kg/m³) |
|---|---|---|---|
| No. 1: | 50 | 100 | 25.0 |
| No. 2: | 50 | 200 | 12.5 |
| No. 3: | 50 | 300 | 8.33 |
| No. 4: | 50 | 400 | 6.25 |
| No. 5: | 50 | 500 | 5.00 |
| No. 6: | 50 | 600 | 4.17 |
| No. 7: | 50 | 700 | 3.57 |

Note that, $Z_S = \sqrt{(\rho E)}$

Figure 5A:
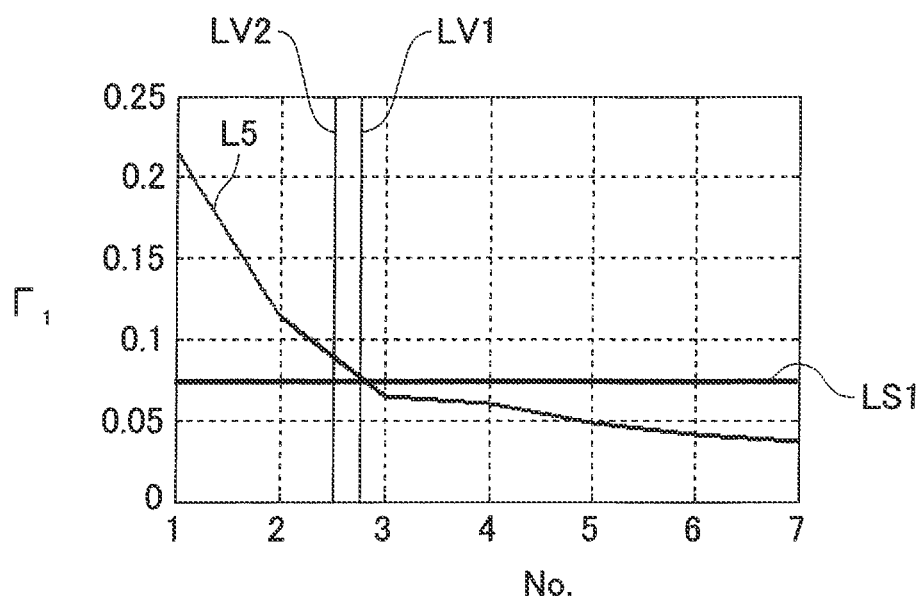
FIG. 5A and FIG. 5B are other graphs which show the reflection coefficient $\Gamma_1$ per electrode finger and electromechanical coupling factor $K^2$.
Figure 5B:
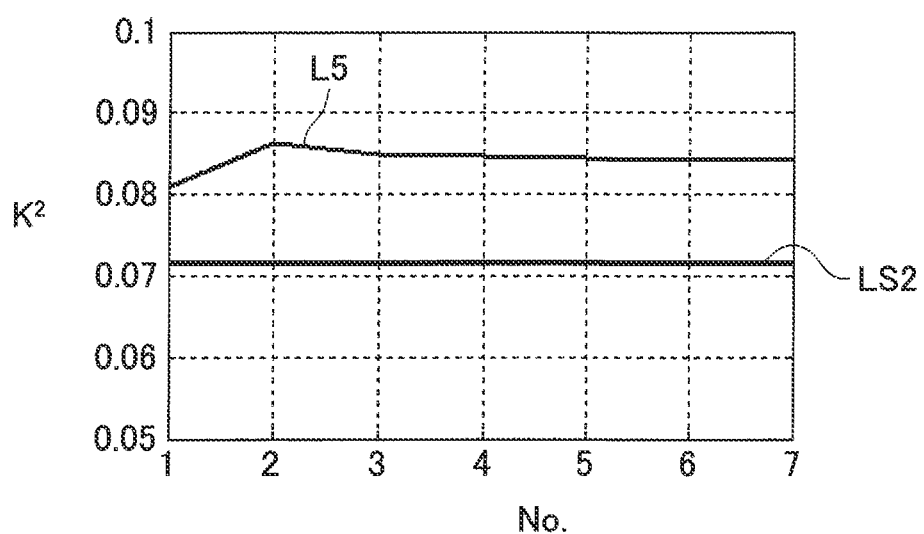

FIG. 5A and FIG. 5B are graphs which shows results by calculating based on the above conditions. The abscissa shows No., and the ordinate shows the reflection coefficient $\Gamma_1$ per electrode finger 13b or electromechanical coupling factor $K^2$. The line L5 shows the calculation results.

In FIG. 5A, even when the acoustic impedances $Z_S$ are the same, the smaller the Young's modulus E and the larger the density ρ, the larger the reflection coefficient $\Gamma_1$. Further, the ratio of change of the reflection coefficient $\Gamma_1$ in No. 1 to No. 3 becomes larger than the ratio of change of the reflection coefficient $\Gamma_1$ in No. 3 to No. 7. In other words, near No. 3, there is room for finding critical significance.

It is considered that the change of the reflection coefficient $\Gamma_1$ is caused by the difference of propagation velocity of the acoustic wave in the materials configuring the first film 9. First, by the waveguide theory, the vibration distribution becomes larger in a region of a medium having a slower propagation velocity of the acoustic wave. On the other hand, the propagation velocities V of the acoustic wave in the hypothetical materials No. 1 to No. 7 become as follows (unit: m/s). Note that, $V=\sqrt{(E/\rho)}$.

| No. 1: 2000 | No. 2: 4000 | No. 3: 6000 |
| No. 3: 8000 | No. 4: 10000 | No. 6: 12000 |
| No. 7: 14000 | | |

Accordingly, it is considered that, even in first films 9 which have equivalent acoustic impedances, the reflection coefficient becomes effectively higher in the first film 9 having a slow propagation velocity of the acoustic wave in which the vibration distribution is concentrated to the first film 9 than the first film 9 having a fast propagation velocity of the acoustic wave in which the vibration distribution is dispersed to the periphery.

Further, the propagation velocity of the acoustic wave of $SiO_2$ is 5560 m/s, and the propagation velocity of the acoustic wave of Al is 5020 m/s. Accordingly, the propagation velocities of the acoustic wave of the first films 9 in No. 1 and No. 2 are slower than the propagation velocities of the acoustic wave through the protective layer 11 and IDT electrode 5, and the propagation velocities of the acoustic wave of the first films 9 in No. 3 to No. 7 are faster than the propagation velocities of the acoustic wave through the protective layer 11 and IDT electrode 5. Accordingly, the change of the ratio of change of the reflection coefficient near No. 3 explained above can also be explained by the propagation velocities of the acoustic wave.

Note that, in FIG. 5A, the propagation velocities of the acoustic wave in $SiO_2$ and Al when regarding the abscissa as the propagation velocity of the acoustic wave are indicated by lines LV1 and LV2. Further, for the electromechanical coupling factor $K^2$ shown in FIG. 5B, a large change does not occur even when the Young's modulus and density $\rho$ change. The factor is contained in the preferred range.

As described above, the first film 9 is preferably made of a material which has a different acoustic impedance from the materials forming the protective layer 11 and the IDT electrode 5 and which has a slower propagation velocity of the acoustic wave than the materials forming the protective layer 11 and the IDT electrode 5. Note that, materials having acoustic impedances larger than the materials forming the protective layer 11 and the IDT electrode 5, compared with materials having smaller acoustic impedances, tend to satisfy the condition that the propagation velocity of the acoustic wave be slower than the materials forming the protective layer 11 and the IDT electrode 5, and are easily selected.

As such a material, for example, there can be mentioned $Ta_2O_5$, $TaSi_2$, and $W_5Si_2$. Their physical property values (acoustic impedance $Z_S$, propagation velocity V of acoustic wave, Young's moduluses E, and density $\rho$) are as follows.

| | $Z_S$ (MRayl) | V (m/s) | E (GPa) | $\rho$ ($10^3$ kg/m$^3$) |
|---|---|---|---|---|
| $Ta_2O_5$: | 33.8 | 4352 | 147 | 7.76 |
| $TaSi_2$: | 40.6 | 4438 | 180 | 9.14 |
| $W_5Si_2$: | 67.4 | 4465 | 301 | 15.1 |

Note that, WC and TiN exemplified in FIG. 4A do not satisfy the condition that the propagation velocity of the acoustic wave be slower than the materials forming the protective layer 11 and the IDT electrode 5 (V of WC: 6504 m/s, V of TiN: 10721 m/s).

The reflection coefficient was calculated for $Ta_2O_5$ (difference of acoustic impedance between Al and $SiO_2$ is about 20 MRayl) which has an acoustic impedance further closer to the acoustic impedances of the protective layer 11 and the IDT electrode 5 than even $TaSi_2$ (FIG. 4A, line L3) to confirm the above knowledge about the materials.

The calculation conditions are as follows.

Normalized thickness e/λ of IDT electrode 5: 0.08

Normalized thickness T/λ of protective layer 11: 0.27, 0.30 or 0.33

Normalized thickness t/λ of first film 9: Changed within a range of 0.01 to 0.09.

Figure 6:
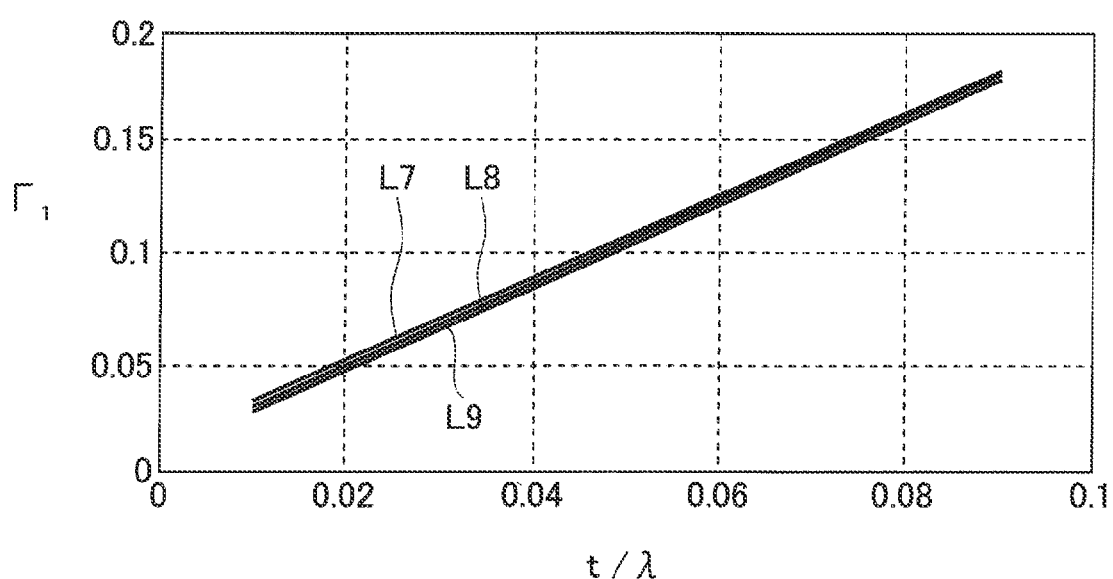
FIG. 6 another graph which shows the reflection coefficient $\Gamma_1$ per electrode finger.

FIG. 6 is a graph which shows the results of calculation based on the above conditions. The abscissa and ordinate are same as the ordinate and abscissa in FIG. 4A. Note that, lines L7, L8, and L9 respectively correspond to cases where the normalized thicknesses T/λ of the protective layer 11 are 0.27, 0.30, and 0.33 (lines L7, L8, and L9 are substantially superimposed on each other).

In FIG. 6, with $Ta_2O_5$, compared with TiN (FIG. 4A, line L2), irrespective of the fact that the acoustic impedance is close to the acoustic impedance of the protective layer 11, the reflection coefficient becomes high, since the propagation velocity of the acoustic wave is slow.

FIG. 6 shows that the normalized thickness T/λ of the protective layer 11 generally does not exert an influence upon the reflection coefficient.

Next, the preferred range of the normalized thickness t/λ of the first film 9 is studied. First, the lower limit value of the preferred range (hereinafter sometimes "of the preferred range" is omitted and the "lower limit value" is simply referred to) of the normalized thickness t/λ of the first film 9 is studied.

Figure 7A:
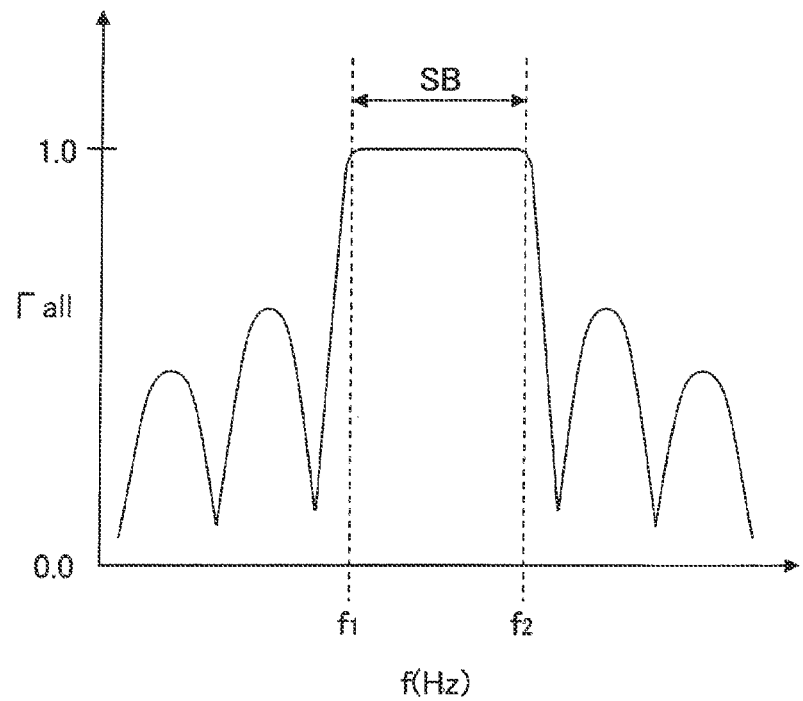
FIG. 7A and FIG. 7B are diagrams for explaining how to find the lower limit of a preferred range of thickness of a first film.

FIG. 7A is a graph which schematically shows the reflection coefficient $\Gamma_{all}$ of the IDT electrode 5 (all electrode fingers 13b). In FIG. 7A, the abscissa shows the frequency f, and the ordinate shows the reflection coefficient $\Gamma_{all}$.

The frequency band ($f_1$ to $f_2$) in which the reflection coefficient $\Gamma_{all}$ substantially becomes 1 (100%) is called the "stop-band". Note that, in practical use, the reflection coefficient $\Gamma_{all}$ in the stop-band does not have to be exactly 1. For example, a frequency band in which the reflection coefficient $\Gamma_{all}$ is 0.99 or more may be specified as the stop-band. Further, in general, at the lower end f1 and upper end f2 of the stop-band, the reflection coefficient $\Gamma_{all}$ rapidly changes, therefore the interval between these changes may be specified as the stop-band as well.

The reflection coefficient $\Gamma_{all}$ of the IDT electrode 5 is determined by the reflection coefficient $\Gamma_1$ per electrode finger 13b and the number of electrode fingers 13b and so on. Further, as generally known, the smaller the reflection coefficient $\Gamma_1$, the smaller the width SB of the stop-band.

Figure 7B:
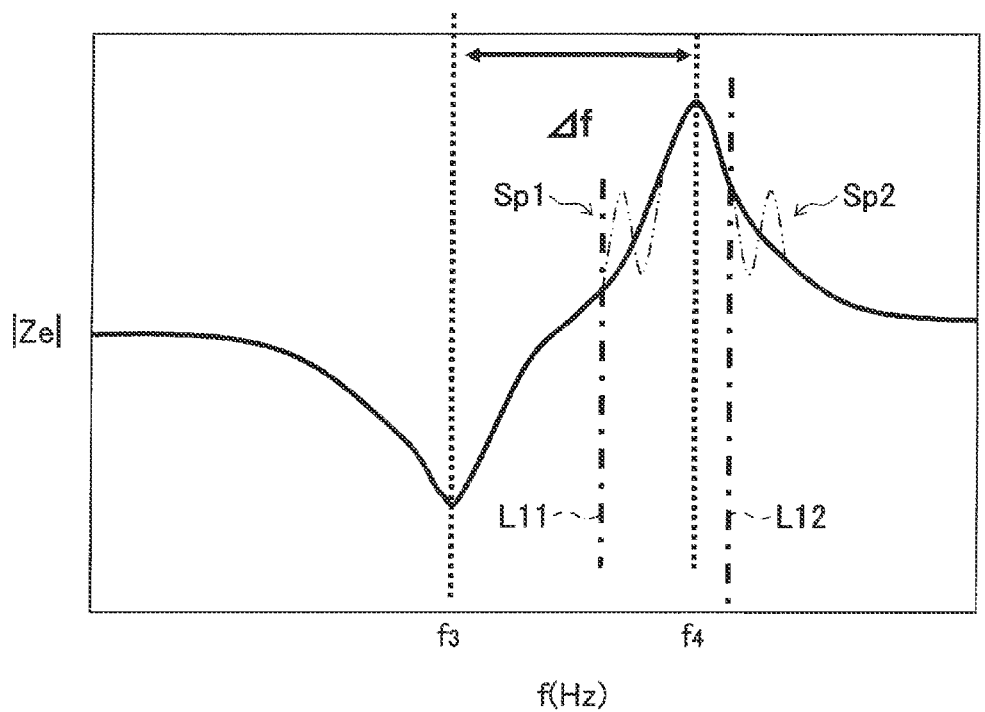

FIG. 7B is a graph which schematically shows an electrical impedance Ze of the IDT electrode 5.

In FIG. 7B, the abscissa shows the frequency "f", and the ordinate shows the absolute value |Ze| of the impedance. As generally known, |Ze| takes the local minimum value at the resonant frequency $f_3$ and takes the local maximum value at the antiresonant frequency $f_4$. Further, when the normalized thickness t/λ of the first film 9 is changed, the upper end $f_2$ of the stop-band and the antiresonant frequency $f_4$ change in a state where the lower end $f_1$ of the stop-band and the resonant frequency $f_3$ coincide. The ratio of change at this time is larger in the upper end $f_2$ of the stop-band than the resonant frequency $f_4$.

Here, when assuming that the upper end f2 of the stop-band is a frequency indicated by the line L11 which is lower than the antiresonant frequency $f_4$, as indicated by an imaginary line (two dotted chain line) in a region Sp1, a spurious wave is generated in a frequency band (width Δf) between the resonant frequency $f_3$ and the antiresonant frequency $f_4$. As a result, the desired filter characteristics etc. are liable to not be obtained.

On the other hand, when assuming that the upper end f2 of the stop-band is a frequency indicated by the line L12 which is higher than the antiresonant frequency $f_4$, as indicated by the imaginary line (two dotted chain line) in a region Sp2, a spurious wave is generated at a frequency higher than the antiresonant frequency $f_4$. In this case, the influence of the spurious wave exerted upon the filter characteristic etc. is suppressed.

Accordingly, the upper end $f_2$ of the stop-band is preferably a higher frequency than the antiresonant frequency $f_4$. Here, the upper end $f_2$ of the stop-band depends upon the reflection coefficient, therefore the reflection coefficient of the IDT electrode 5 may be adjusted so that the upper end $f_2$ of the stop-band becomes a frequency higher than the antiresonant frequency $f_4$. Further, the reflection coefficient of the IDT electrode 5 linearly increases as the normalized thickness $t/\lambda$ of the first film 9 becomes larger as shown in FIG. 4 and FIG. 6. Therefore, by adjusting the normalized thickness $t/\lambda$ of the first film 9, the upper end $f_2$ of the stop-band can be made a frequency higher than the antiresonant frequency $f_4$. That is, by adjusting the normalized thickness $t/\lambda$ of the first film 9 to a thickness so that the upper end $f_2$ of the stop-band becomes higher than the antiresonant frequency $f_4$, generation of a spurious wave is suppressed in the frequency band (width $\Delta f$) between the resonant frequency $f_3$ and the antiresonant frequency $f_4$.

Here, as shown in FIG. 6, the reflection coefficient $\Gamma_1$ is influenced by the normalized thickness $T/\lambda$ of the protective layer 11. Further, the width $\Delta f$ is influenced by the normalized thickness $T/\lambda$ of the protective layer 11. Therefore, the normalized thickness $t/\lambda$ of the first film 9 is preferably determined in accordance with the normalized thickness $T/\lambda$ of the protective layer 11.

Therefore, the normalized thickness $t/\lambda$ by which the upper end $f_2$ of the stop-band becomes equivalent to the antiresonant frequency $f_4$ was calculated while changing the normalized thickness $T/\lambda$ of the protective layer 11. Based on the calculated result, the lower limit value of the normalized thickness $t/\lambda$ was defined based on the normalized thickness $T/\lambda$.

Figure 8:
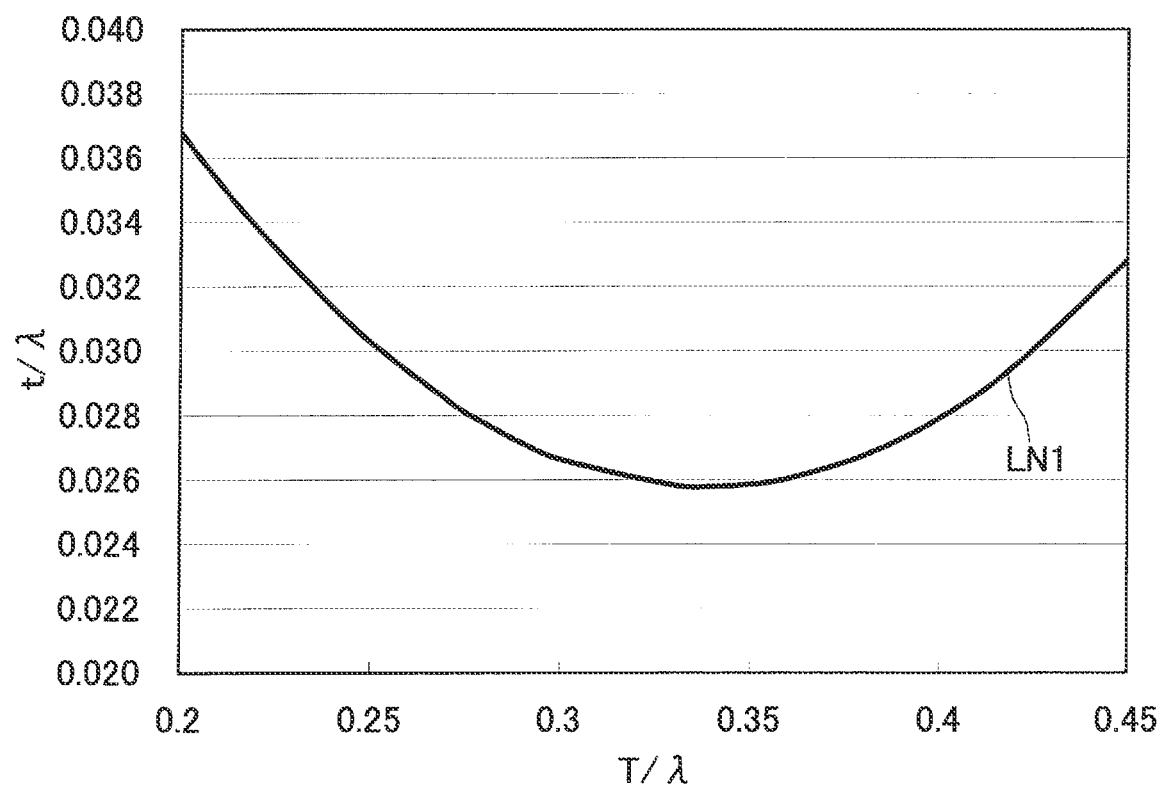
FIG. 8 A graph which shows the lower limit of a preferred range of thickness of a first film made of $Ta_2O_5$.
Figure 9:
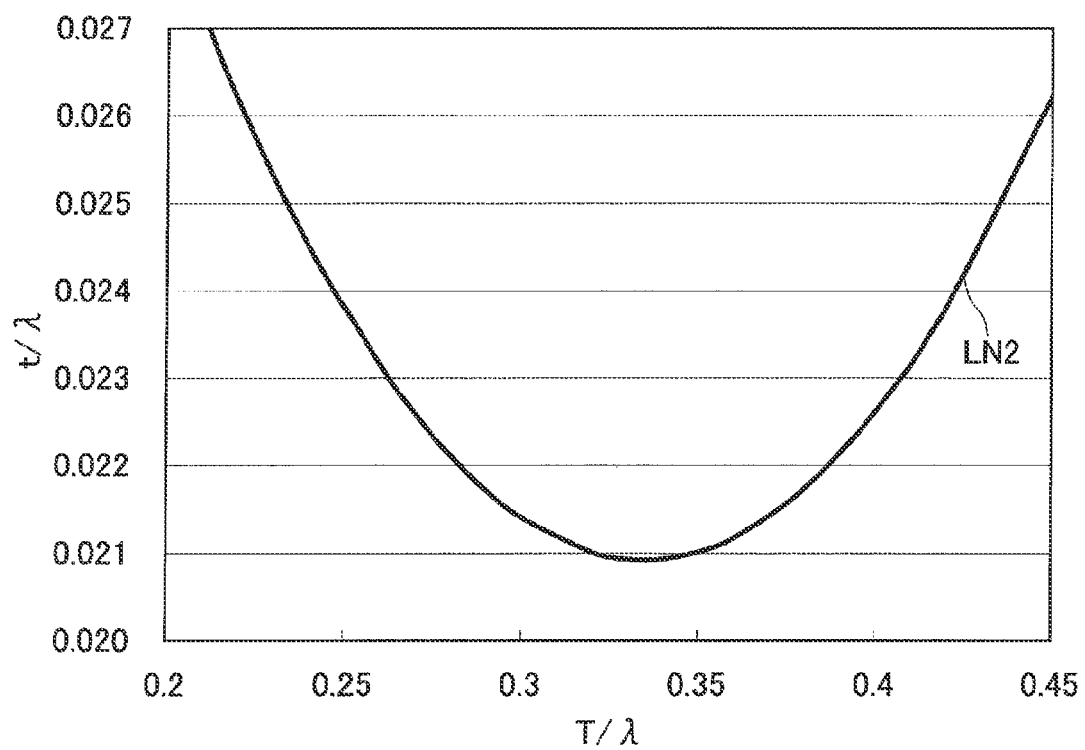
FIG. 9 A graph which shows the lower limit of a preferred range of thickness of a first film made of $TaSi_2$.
Figure 10:
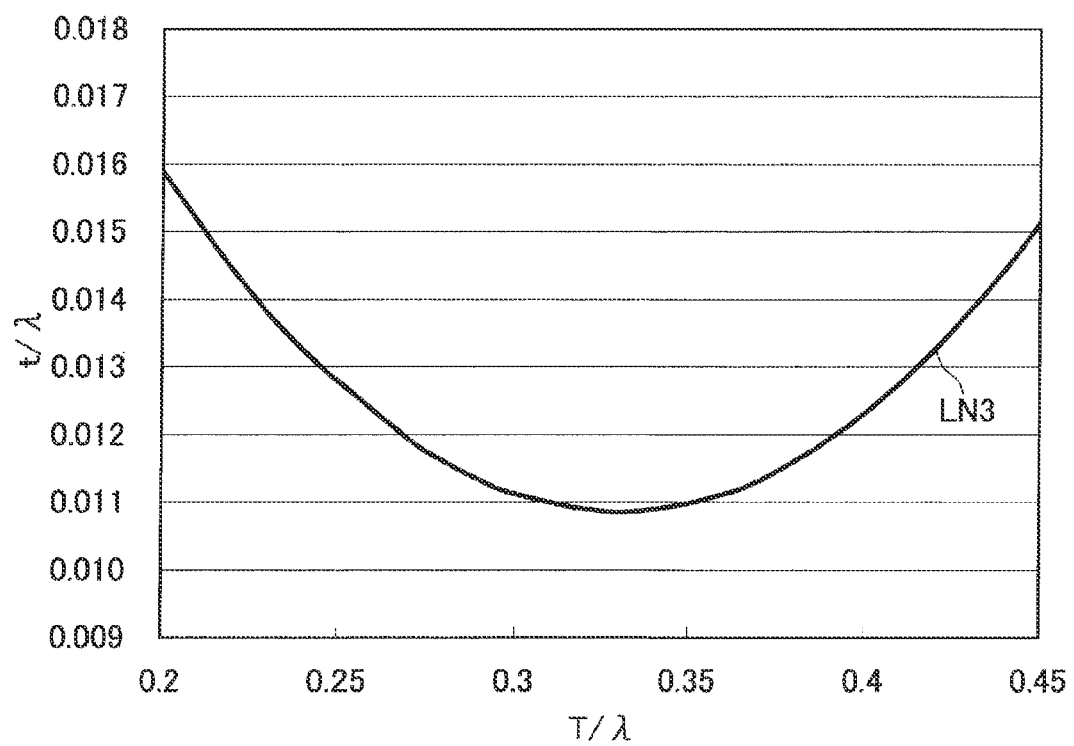
FIG. 10 A graph which shows the lower limit of a preferred range of thickness of a first film made of $W_5Si_2$.

FIG. 8 to FIG. 10 are graphs for explaining normalized thicknesses $t/\lambda$ by which the upper end $f_2$ of the stop-band becomes higher than the antiresonant frequency $f_4$ and respectively correspond to cases where the materials of the first film 9 are $Ta_2O_5$, $TaSi_2$, and $W_5Si_2$.

In FIG. 8 to FIG. 10, the abscissa shows the normalized thickness $T/\lambda$ of the protective layer 11, and the ordinate shows the normalized thickness $t/\lambda$ of the first film 9. Solid lines LN1 to LN3 shown in the diagrams show calculated results of normalized thickness $t/\lambda$ with which the upper end $f_2$ of the stop-band becomes equivalent to the antiresonant frequency $f_4$. Note that, in calculation, the normalized thickness $e/\lambda$ of the IDT electrode 5 was determined to 0.08.

As indicated by the solid lines LN1 to LN3 in the diagrams, for the normalized thickness $t/\lambda$ of the first film 9, approximation curves could be suitably derived by second order curves.

Specifically, this is as follows.

$Ta_2O_5$ (FIG. 8): Lower limit value (solid line LN1):

$$t/\lambda = 0.5706(T/\lambda)^2 - 0.3867 T/\lambda + 0.0913$$

$TaSi_2$ (FIG. 9): Lower limit value (solid line LN2):

$$t/\lambda = 0.3995(T/\lambda)^2 - 0.2675 T/\lambda + 0.0657$$

$W_5Si_2$ (FIG. 10): Lower limit value (solid line LN3):

$$t/\lambda = 0.2978(T/\lambda)^2 - 0.1966 T/\lambda + 0.0433$$

Note that, in all equations of the lower limit value, the local minimum value of the normalized thickness $t/\lambda$ is larger than the largest value (0.01) of the normalized thickness of the adhesion layer shown in Patent Literature 2. In Patent Literature 1, the thickness of the adhesion layer is not normalized by wavelength, therefore comparison is difficult.

However, even when the frequency is made high (for example 2690 MHz which is the largest frequency of UMTS) and the propagation velocity of acoustic wave is made slow (for example 3000 m/s) so that the normalized thickness becomes large, $\lambda = 1.1$ μm, and the largest value (100 Å) of the thickness of the adhesion layer in Patent Literature 1 is less than 0.01 when normalized.

Next, the upper limit value of the preferred range (hereinafter, sometimes "of the preferred range" is omitted and the "upper limit value" is simply referred to) of the normalized thickness $t/\lambda$ of the first film 9 is studied.

As shown in FIG. 4A and FIG. 6, the larger the normalized thickness $t/\lambda$ of the first film 9, the higher the reflection coefficient. Accordingly, the upper limit value of the normalized thickness $t/\lambda$ is a range so that the first film 9 is not exposed from the protective layer 11.

In the same way as the lower limit value of the normalized thickness $t/\lambda$, when the upper limit value of the normalized thickness $t/\lambda$ is defined according to equation, for example, this can be defined as in the following equation by estimating the normalized thickness $e/\lambda$ of the IDT electrode 5 as less than 0.1 in comparison with the normalized thickness $e/\lambda$ in the general SAW element.

$$t/\lambda = T/\lambda - 0.1 \quad \text{Upper limit value:}$$

Figure 11:
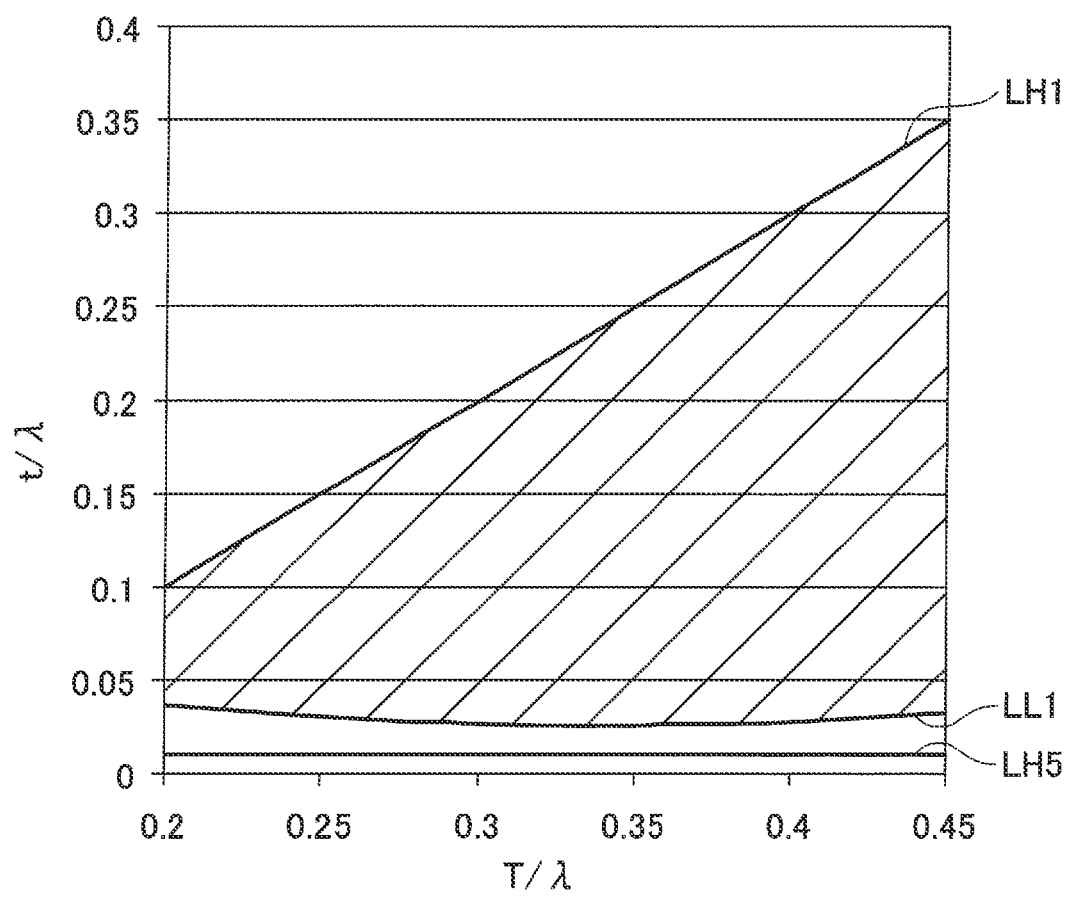
FIG. 11 A graph which shows a preferred range of thickness of a first film made of $Ta_2O_5$.

The preferred range of the normalized thickness $t/\lambda$ derived from the above study is shown in FIG. 11 by taking as an example $Ta_2O_5$.

In FIG. 11, the abscissa and ordinate show the normalized thickness $T/\lambda$ of the protective layer 11 and the normalized thickness $t/\lambda$ of the first film 9 in the same way as FIG. 8. A line LL1 shows the lower limit value, and a line LH1 shows the upper limit value. A hatched region between these lines is the preferred range of the normalized thickness $t/\lambda$ of the first film 9. Note that, a line LH5 shows the upper limit value (0.01) of the adhesion layer indicated in Patent Literature 2.

(Configuration of SAW Device)

Figure 12:
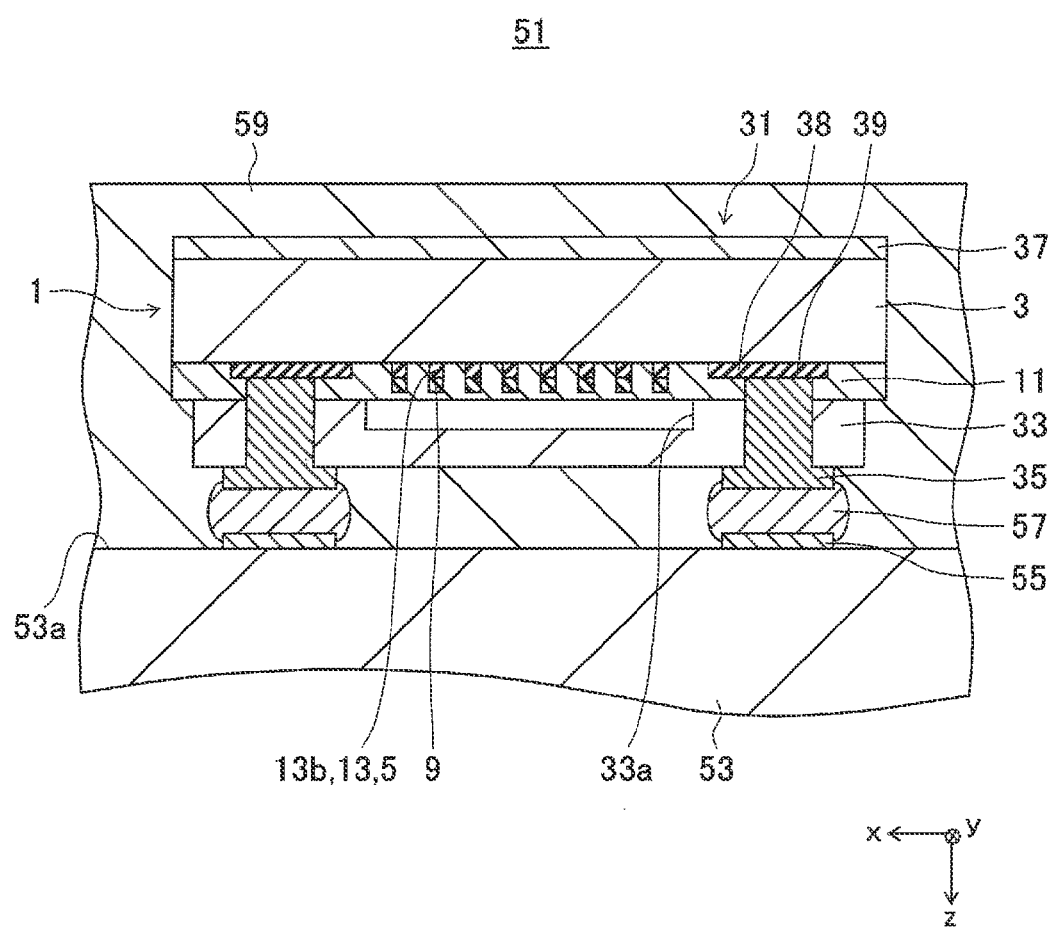
FIG. 12 A cross-sectional view which shows a SAW device according to the first embodiment of the present invention.

FIG. 12 is a cross-sectional view which shows a SAW device 51 according to the present embodiment.

The SAW device 51 configures for example a filter or duplexer. The SAW device 51 has a SAW element 31 and a circuit board 53 on which the SAW element 31 is mounted.

The SAW element 31 is for example configured as a SAW element of a so-called wafer level package. The SAW element 31 has the SAW element 1 explained above, a cover 33 which covers the SAW element 1 side of the substrate 3, terminals 35 which pass through the cover 33, and a back surface portion 37 which covers the opposite side to the SAW element 1 of the substrate 3.

The cover 33 is configured by a resin or the like and forms a vibration space 33a above the IDT electrode 5 and reflectors 7 (positive side in the z-direction) for facilitating the propagation of the SAW. On the upper surface 3a of the substrate 3, lines 38 which are connected to the IDT electrode 5 and pads 39 which are connected to the lines 38 are formed. The terminals 35 are formed on the pads 39 and are electrically connected to the IDT electrode 5. Though particularly not shown, the back surface portion 37 for example has a back surface electrode for discharging electrical charges charged in the surface of the substrate 3 due to temperature variation etc. and an insulation layer covering the back surface electrode.

The circuit board 53 is configured by a for example so-called rigid type printed circuit board. On a mount surface 53a of the circuit board 53, mount-use pads 55 are formed.

The SAW element 31 is arranged so that the cover 33 side faces the mount surface 53a. Then, the terminals 35 and the mount-use pads 55 are bonded by solder 57. After that, the SAW element 31 is sealed by a seal resin 59.

Second Embodiment

Figure 13A:
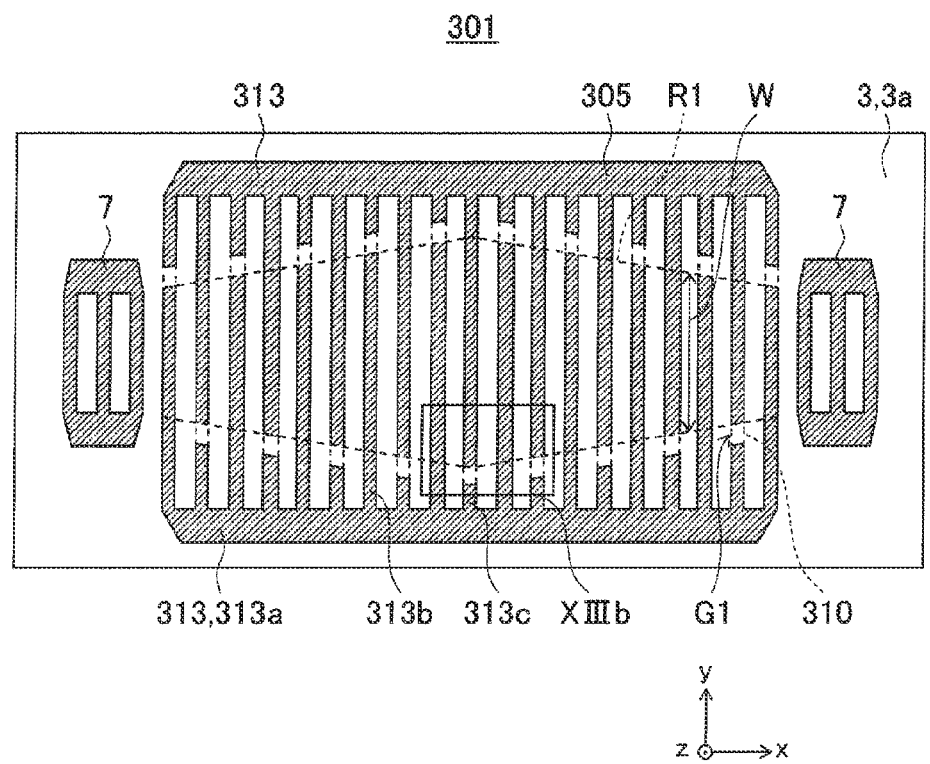
FIG. 13(a) and FIG. 13B are a plan view and a partially enlarged perspective view of a SAW element according to a second embodiment.

FIG. 13A is a plan view which shows a SAW element 301 according to a second embodiment.

An IDT electrode 305 of the SAW element 301 is made of Al or an alloy which contains Al as a major component in the same way as the IDT electrode 5 in the first embodiment and has a pair of comb-shaped electrodes 313. Further, each comb-shaped electrode 313 has a bus bar 313a and a plurality of electrode fingers 313b in the same way as the comb-shaped electrodes 13 in the first embodiment.

Further, each comb-shaped electrode 313 has a plurality of dummy electrodes 313c extending between two or more electrode fingers 313b from the bus bar 313a toward the bus bar 313a side of the other comb-shaped electrode 313. Tip ends of the plurality of dummy electrodes 313c of each comb-shaped electrode 313 face the tips of the plurality of electrode fingers 313b of the other comb-shaped electrode 313 through tip gap portions G1. The width of a dummy electrode 313c (size in the x-direction) is for example equivalent to the width of an electrode finger 313b. The length of a tip gap portion G1 (size in the y-direction) is for example about a half wavelength ($\lambda/2$).

To the IDT electrode 305, so-called apodizing is applied. That is, by change of the length of the plurality of electrode fingers 313b in accordance with their positions in the x-direction, the width W in the y-direction of the range in which the plurality of electrode fingers 313b of the pair of comb-shaped electrodes 313 cross (crossing range R1) changes in accordance with the positions in the x-direction. FIG. 13 exemplifies a case where the width W becomes large at the center of the x-direction of the IDT electrode 5, and the width W becomes small on the two sides in the x-direction. The plurality of dummy electrodes 313c have lengths different from each other corresponding to the change of the width W so that lengths of the plurality of tip gap portions G1 become substantially the same as each other. Note that, the IDT electrode 305 may be one which is not subjected to apodizing.

Figure 13B:
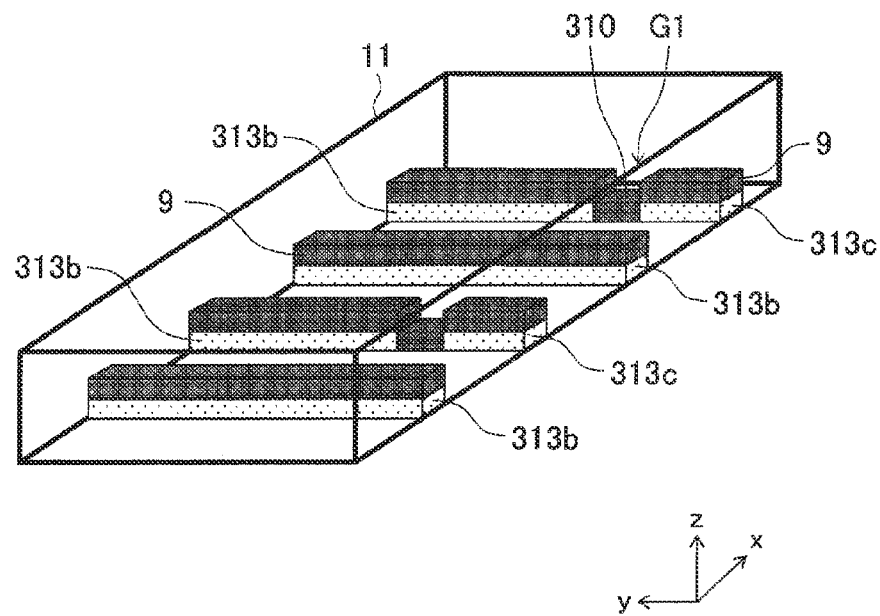

FIG. 13B is a perspective view in a region XIIIb in FIG. 13A. Note that, the figure shows the state through the protective layer 11.

On the upper surface of the IDT electrode 305, in the same way as the first embodiment, the first film 9 is provided. The first film 9 is provided not only on the bus bar 313a (not shown in FIG. 13B) and electrode fingers 313b, but also on the upper surfaces of the dummy electrodes 313c.

Further, in the SAW element 301, a second film 310 is arranged on the tip gap portions G1. The second film 310 is formed by a material which contains as a major component an insulating material which has a larger acoustic impedance than the materials of the IDT electrode 305 and the protective layer 11 ($SiO_2$) and has a slower propagation velocity of the acoustic wave than the material of the IDT electrode 305 and $SiO_2$. For example, the second film 310 is formed by the same material as the material of the first film 9.

The second film 310 for example completely buries the tip gap portions G1 when viewed by a plan view. That is, the second film 310 is provided from the tips of the electrode fingers 313b to the tips of the dummy electrodes 313c and has widths (sizes in the x-direction) equivalent to the electrode fingers 313b and dummy electrodes 313c. The thickness of the second film 310 is for example equivalent to the thickness of the first film 9.

FIG. 14A to FIG. 14G are diagrams for explaining the method of production of the SAW element 301. The upper part in each diagram shows a partially enlarged cross-sectional view of the SAW element 301 (see the XIV-XIV line in the lower part in FIG. 14A), and the lower part shows a partially enlarged perspective view of the SAW element 301.

Contrary to the method of production of the SAW element 1 in the first embodiment in which the IDT electrode 5 and the first film 9 were simultaneously etched, in the method of production of the SAW element 301, the IDT electrode 305 and the first film 9 are separately etched. Specifically, this is as follows.

The procedure is the same as the first embodiment until a conductive layer 15 which becomes the IDT electrode 305 and reflectors 7 (explanation of the reflectors 7 is omitted below) etc. is formed on the upper surface 3a of the substrate 3.

Next, as shown in FIG. 14A, on the conductive layer 15, a resist layer 319 is formed as the mask for etching the conductive layer 15. The method of formation of the resist layer 319 is the same as the resist layer 19 in the first embodiment.

After that, as shown in FIG. 14B, the conductive layer 15 is etched by suitable etching process such as RIE or the like and the IDT electrode 305 is formed. Then, as shown in FIG. 14C, the resist layer 319 is removed by using a suitable chemical solution.

Next, as shown in FIG. 14D, to cover the IDT electrode 305 and the portions of the upper surface 3a of the piezoelectric substrate 3 which are exposed from the IDT electrode 305, an additional layer 17 which becomes the first film 9 and second film 310 is formed. The method of formation of the additional layer 17 is the same as that in the first embodiment. Note that, by suitably setting the thin film formation conditions, it is possible to make the thickness at the tip gap portions G1 of the additional layer 17 equivalent to the thickness of the additional layer 17 on the IDT electrode 305 or thicker than this thickness.

Next, as shown in FIG. 14E, on the additional layer 17, a resist layer 320 is formed as the mask for etching the additional layer 17. The planar shape of the resist layer 320 differs from the resist layer 319 in only the point that no openings are formed at the tip gap portions G1. Note that, the method of formation of the resist layer 320 is the same as the resist layer 319.

After that, as shown in FIG. 14F (particularly lower part), the additional layer 17 is etched by suitable etching process such as RIE or the like and the first film 9 and second film 310 are formed. Then, as shown in FIG. 14G, the resist layer 320 is removed by using a suitable chemical solution.

Figure 15A:
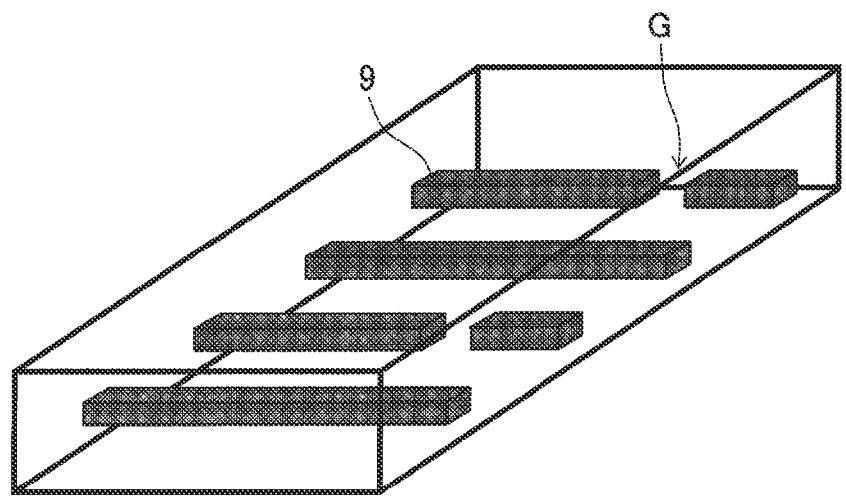
FIG. 15(a) and FIG. 15B are perspective views for explaining the mode of operation of the second embodiment.
Figure 15B:
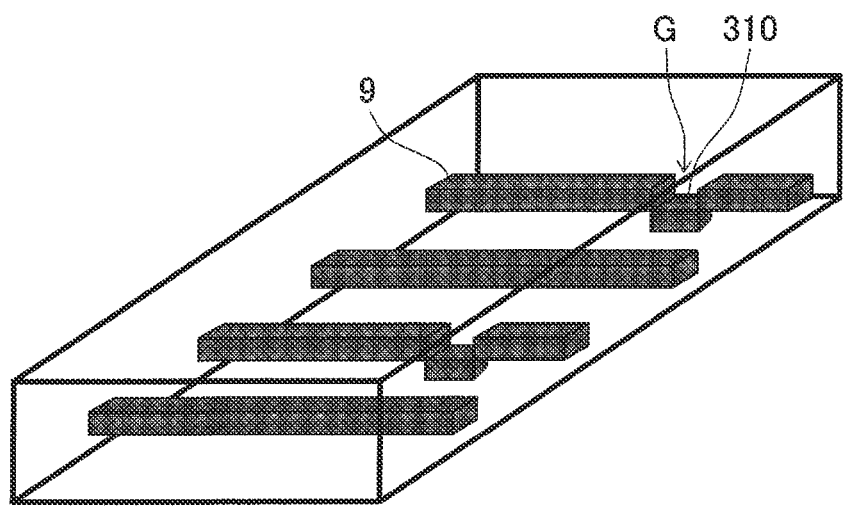

FIG. 15A and FIG. 15B are perspective views for explaining the mode of operation of the present embodiment.

FIG. 15A is a diagram which acoustically views the structure on the piezoelectric substrate 3 in a case where the second film 310 is not provided. As shown in this diagram, when acoustically viewed, the boundary between the IDT electrode 5 made of Al or a metal which contains Al as a major component and the protective layer 11 made of $SiO_2$ becomes vague, and only the first film 9 arranged on the upper surface of the IDT electrode 5 is seen. Further, the tip gap portions G1 become missing parts in the stripes configured by the first film 9.

Accordingly, in the tip gap portions G1, scattering etc. of SAW occurs, and loss occurs as a result of that. In particular, where apodizing is applied to the IDT electrode 305, compared with the case where apodizing is not applied, the tip gap portions G1 are located at the center side between bus bars 313a, therefore the loss is apt to become large.

FIG. 15B is a diagram which acoustically views the structure on the piezoelectric substrate 3 in the present embodiment (case where the second film 310 is provided). As shown in this diagram, by provision of the second film 310, the missing parts of the stripes configured by the first film 9 are buried. As a result, scattering etc. of SAW in the tip gap portions G1 is suppressed, and loss is suppressed.

According to the above second embodiment, by provision of the first film 9, in the same way as the first embodiment, the effect is exhibited that the reflection coefficient can be made high. Further, as explained above, scattering of SAW in the tip gap portions G1 is suppressed. The second film 310 is formed by the same material as the first film 9. In other words, the second film 310 acoustically exhibits the same properties as the first film 9. Therefore, the second film 310 can acoustically suitably bury the tip gap portions G1. Further, the second film 310 can be produced simultaneously with the first film 9, therefore the manufacturing process is simplified.

Third Embodiment

Figure 16A:
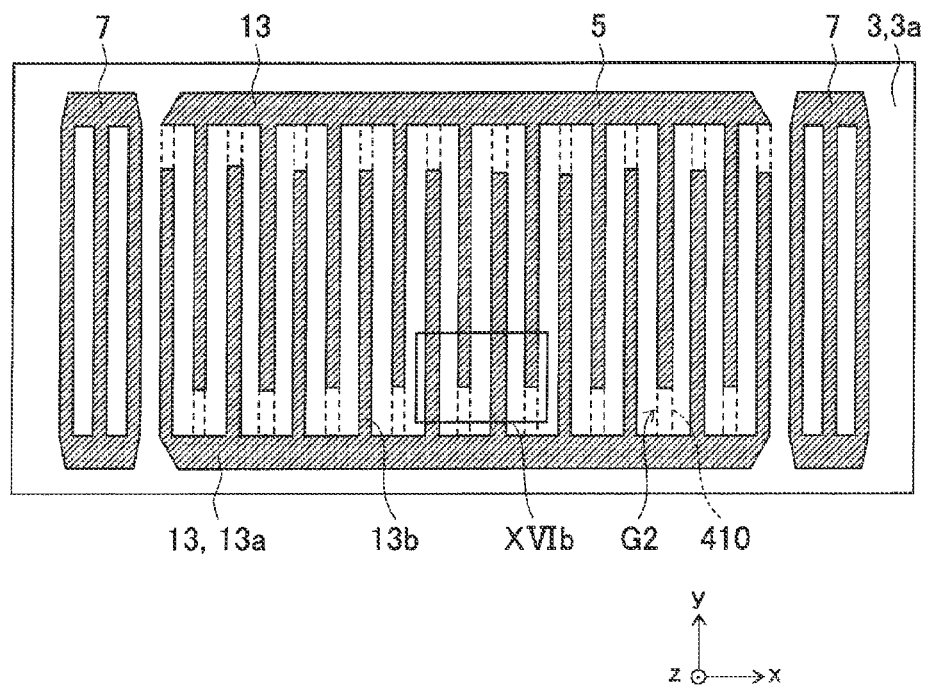
FIG. 16(a) and FIG. 16B are a plan view and a partially enlarged perspective view of a SAW element according to a third embodiment.

FIG. 16A is a plan view which shows a SAW element 401 according to a third embodiment.

The IDT electrode 5 of the SAW element 401 is the same as the IDT electrode 5 in the first embodiment. That is, the dummy electrodes 313c shown in the second embodiment are not provided. Further, the tips of the plurality of electrode fingers 13b of each comb-shaped electrode 13 face the bus bar 13a of the other comb-shaped electrode 13 through a plurality of tip gap portions G2. Note that, the IDT electrode 5 may be apodized in the same way as the second embodiment.

Figure 16B:
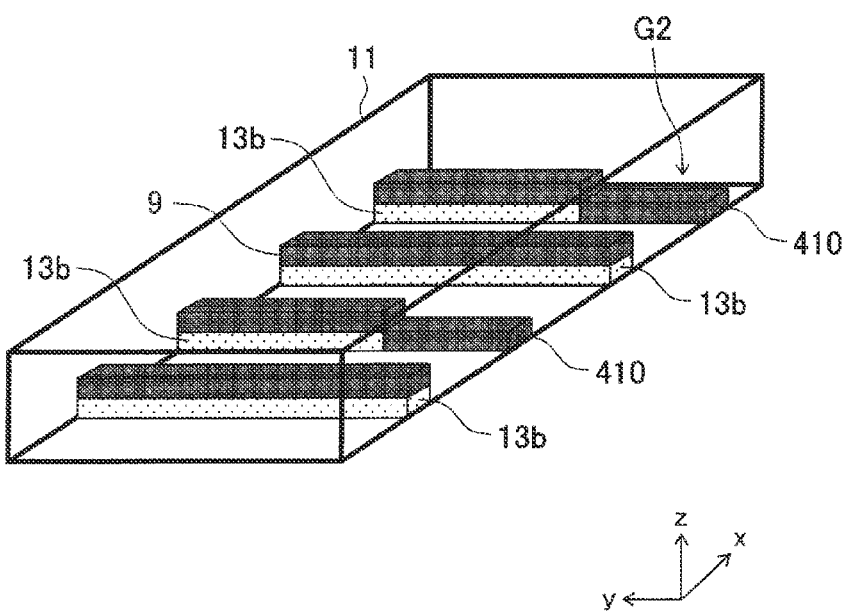

FIG. 16B is a perspective view in a region XVIb in FIG. 16A. Note that, the figure shows the state through the protective layer 11.

On the upper surface of the IDT electrode 5, the first film 9 is provided in the same way as the first embodiment. Further, in the SAW element 401, the second film 410 is arranged on the tip gap portions G2. The material of the second film 410 is the same as the material of the second film 10 explained in the second embodiment.

The second film 410 completely buries the tip gap portions G2 when viewed by a plan view. That is, the second film 410 is provided over the portions from the tips of the electrode fingers 13b of one comb-shaped electrode 13 to the edge part of the bus bar 13a of the other comb-shaped electrode 13 and has width (sizes in the x-direction) equivalent to the electrode fingers 13b. The thickness of the second film 410 is for example equivalent to the thickness of the first film 9.

The second film 410 for example is formed simultaneously with the formation of the first film 9 by patterning of the additional layer 17 in the same way as the second film 310 in the second embodiment.

Note that, as in the above explanation, the SAW element 410 can be grasped as being obtained by providing the second film 410 on the tip gap portions G2 in the first embodiment, however, it can be grasped as being obtained by eliminating the dummy electrodes 313c while leaving the first film 9 on the dummy electrodes 313c in the second embodiment as well.

According to the above third embodiment, by provision of the first film 9, in the same way as the first embodiment, the effect is exhibited of being able to raise the reflection coefficient. Further, by provision of the second film 410, in the same way as the second embodiment, scattering of the SAW at the tip gap portions G2 is suppressed.

Further, in the second embodiment, the velocity of SAW is different among the crossing range R1 and the arrangement regions of tip gap portions G1 and dummy electrodes 313c, so discontinuity of the velocity occurs. Contrary to this, in the third embodiment, by elimination of the dummy electrodes 313c, the number of discontinuous parts of velocity decreases. As a result, suppression of scattering of SAW in the discontinuous parts of velocity can be expected.

Fourth Embodiment

Figure 17A:
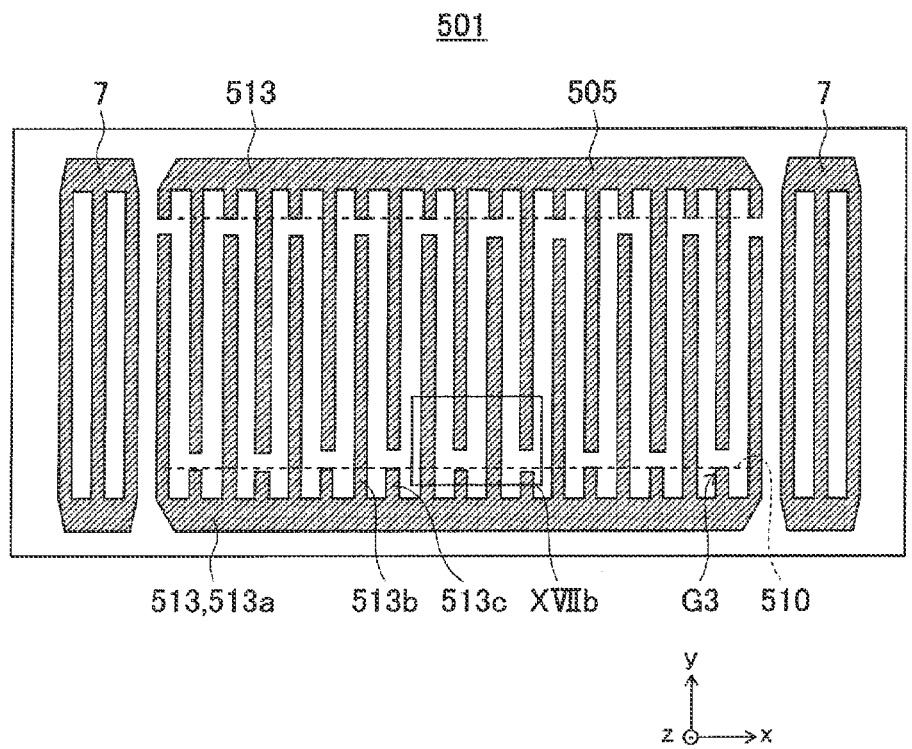
FIG. 17(a) and FIG. 17B are a plan view and a partially enlarged perspective view of a SAW element according to a fourth embodiment.

FIG. 17A is a plan view which shows a SAW element 501 according to a fourth embodiment.

An IDT electrode 505 of a SAW element 501 has dummy electrodes 513c in the same way as the second embodiment and is not apodized in the same way as the first embodiment. However, the IDT electrode 505 may be apodized in the same way as the second embodiment as well.

Figure 17B:
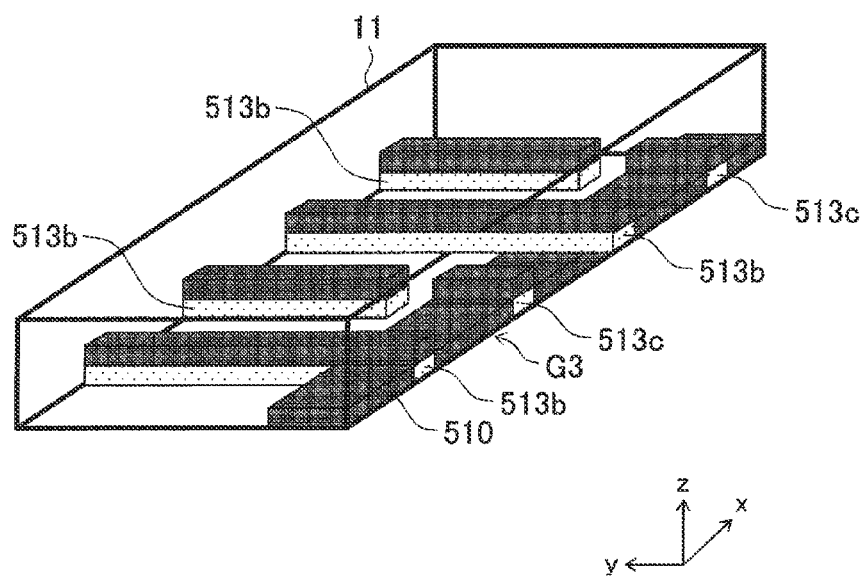

FIG. 17B is a perspective view in a region XVIIb in FIG. 17A. Note that, the figure shows the state through the protective layer 11.

On the upper surface of the IDT electrode 505, in the same way as the other embodiments, the first film 9 is provided. Further, in the SAW element 501, a second film 510 is provided on side gap portions G3 between dummy electrodes 513c and electrode fingers 513b which belong to the same comb-shaped electrode 513 and are adjacent to each other.

The second film 510 for example completely buries the side gap portions G3 when viewed by a plan view. That is, the second film 510 is provided over a portion from the edge portions of the electrode fingers 513b to the edge portions of the dummy electrodes 513c adjacent to the former and is provided over portions from the edge portion of the bus bar 513a to the tips of the dummy electrodes 513c. The thickness of the second film 510 is for example equivalent to the thickness of the first film 9.

The second film 510 for example is formed simultaneously with the formation of the first film 9 by patterning of the additional layer 17 in the same way as the second film 310 in the second embodiment.

According to the above fourth embodiment, by provision of the first film 9, in the same way as the first embodiment, the effect is exhibited of being able to raise the reflection coefficient. Further, in the fourth embodiment, the difference of velocity between the SAW which propagates in the crossing region and the SAW which propagates in the region of the second film 510 becomes large, and it is expected that the effect of sealing in the SAW in the crossing region rises. As a result, suppression of loss is expected.

Note that, in the above embodiments, the substrate 3 is one example of the piezoelectric substrate, the IDT electrodes 5, 305, and 505 are examples of the electrode, and the protective layer 11 is an example of the insulation layer.

The above embodiments may be worked suitably combined. For example, the second film 510 in the fourth embodiment may be provided between root portions of the plurality of electrode fingers 13b belonging to the same comb-shaped electrode 13 in an IDT electrode 5 having a configuration in which there are no dummy electrodes as in the first embodiment or may be provided together with the second film 310 in the second embodiment.

The present invention is not limited to the above embodiments and may be executed in various ways.

The acoustic wave element is not limited to a SAW element (in a narrow sense). For example, it may also be a so-called elastic boundary wave element (note, included in a SAW element in a broad sense) in which the thickness of the insulation layer (11) is relatively large (for example 0.5λ to 2λ). Note that, in an elastic boundary wave element, the formation of the vibration space (33a) is unnecessary, and accordingly the cover 33 etc. are unnecessary too.

Further, the acoustic wave element is not limited to a wafer level packaged one. For example, in the SAW element, the cover 33 and terminal 35 etc. need not be provided, and the pads 39 on the upper surface 3a of the substrate 3 and the mount-use pads 55 of the circuit board 53 may be directly bonded by solder 57. Further, the vibration space may be formed by a clearance between the SAW element 1 (protective layer 11) and the mount surface 53a of the circuit board 53.

The first film is preferably provided over the entire surface of the electrode. However, the first film may be provided at only a portion of the electrode as well, for example, may be provided only on the electrode fingers. Further, the first film may be provided not only on the upper surface of the electrode, but also over the side surfaces. The material of the first film may be a conductive material or insulation material. Specifically, tungsten, iridium, tantalum, copper, and other conductive materials and $Ba_xSr_{1-x}O_3$, $Pb_xZn_{1-x}O_3$, $ZnO_3$, and other insulation materials can be mentioned as the materials of the first film.

The upper surface of the protective layer may have relief so that it sticks out at the positions of the electrode fingers. In this case, the reflection coefficient can be made further higher. The relief may be formed due to the thickness of the electrode fingers at the time of formation of the protective layer as explained with reference to FIG. 2E or may be formed by etching the surface of the protective layer in the region between the electrode fingers.

Further, for the substrate 3, other than the 128°±10° Y-X cut $LiNbO_3$ substrate, use can be made of for example 38.7°±Y-X cut $LiNbO_3$ etc.

The two bus bars (first bus bar and second bus bar) which face each other in the direction crossing to the propagation direction of the acoustic wave need not be parallel to the propagation direction of the acoustic wave and may be inclined relative to the propagation direction of the acoustic wave. Further, the bus bars need not be straight shapes and may extend in a curved shaped or be bent. Further, the widths of the bus bars need not be constant and may be changed.

The second film (310 or 410) burying the tip gaps does not have to completely bury the tip gap portions. For example, the second film may be smaller in widths (x-direction) and/or lengths (y-direction) than the tip gap portions. So far as the tip gap portions are buried by the second film to some extent, scattering is suppressed compared with the case where the second film does not exist. Conversely, the second film may be larger than the tip gap portions as well. For example, the second film may be larger in widths (x-direction) than the widths of the electrode fingers.

The second film is not limited to the one exemplified in the embodiments. For example, the second film may be formed in the region adjacent to the x-direction with respect to the tip gap portions G1 in the second embodiment. In this case as well, the tip gap portions G1 are closed by the second film when seen in the propagation direction of the SAW, so the drop of loss is suppressed. Further, the second film is not limited to one acoustically burying the holes. For example, part or all of the reflectors may be configured by the second film as well.

The second film need not be formed by the same material as the first film. Further, the second film is not limited to one formed by a single material and may be configured by for example a plurality of insulation layers.

Note that, from the results of consideration of the first film explained above, so long as the material of the first film is one which contains as a major component a material which has a larger acoustic impedance than the material of the electrode and the material of the insulation layer and has a slower propagation velocity of the acoustic wave than the material of the electrode and the material of the insulation layer, even in a case where a material other than a material which contains Al as a major component is used as the material of the electrode and a material other than a material which contains silicon oxide as a major component is used as the material of the insulation layer, it is guessed that the same effect is obtained, that is, the reflection coefficient can be made higher while compensating for the temperature characteristic.

Further, from the results of consideration for the first film explained above, according to some materials of the electrode and insulation layer, it is considered that sometimes use can be also made of WC indicated by the line L1 in FIG. 4A as the material of the first film.

Further, by forming the first film by the insulation material, compared with forming the first film by a metal material, corrosion of the electrode is suppressed, and the electrical characteristics of the acoustic wave element can be stabilized. This is because, pinholes are sometimes formed in an insulation layer made of $SiO_2$. When such pinholes are formed, moisture intrudes up to the electrode portion through them. If a metal film made of a material different from the electrode material is arranged on the electrode, due to the intruded moisture, corrosion due to a battery effect between dissimilar metals will occur. Accordingly, if the first film is formed by insulation material such as $Ta_2O_5$ or the like, almost no battery effect occurs between the electrode and the first film, therefore an acoustic wave element suppressed in corrosion of electrode and therefore having a high reliability can be obtained.

REFERENCE SIGNS LIST

1 . . . SAW element (acoustic wave element), 3 . . . substrate (piezoelectric substrate), 3a . . . upper surface, 5 . . . IDT electrode (electrode), 9 . . . first film, and 11 . . . protective layer (insulation layer).

The invention claimed is:
1. An acoustic wave element, comprising:
a piezoelectric substrate;
an electrode which is located on an upper surface of the piezoelectric substrate and which contains Al as a major component;
a first film which is located on an upper surface of the electrode; and
an insulation layer which covers the first film and a portion of the piezoelectric substrate which is exposed from the electrode, which has a thickness from the upper surface of the piezoelectric substrate which is larger than a total thickness of the electrode and the first film, and which contains a silicon oxide as a major component, wherein the first film contains as a major component a material which has a larger acoustic impedance than a material of the electrode and a material of the insulation layer and which has a slower propagation velocity of an acoustic wave than the material of the electrode and the material of the insulation layer, and wherein a normalized thickness $t/\lambda$ of the first film is within a range of a following equation (A):

$$t_0/\lambda \leq t/\lambda \leq T/\lambda - 0.1 \quad \text{equation (A)}$$

where $T/\lambda$ is a normalized thickness of the insulation layer, "t" is a thickness of the first film, T is a thickness of the insulation layer, $\lambda$ is a wavelength of the acoustic wave, and $t_0$ is a thickness of the first film where a frequency of an upper end of a stop-band coincides with an antiresonance frequency.

2. The acoustic wave element according to claim 1, wherein the first film contains any of $Ta_2O_5$, $TaSi_2$, and $W_5Si_2$ as a major component.

3. The acoustic wave element according to claim 2, wherein the piezoelectric substrate is a 128°±10° Y-X cut $LiNbO_3$ substrate.

4. The acoustic wave element according to claim 3, wherein
the first film contains $Ta_2O_5$ as a major component, and
the normalized thickness $t/\lambda$ of the first film is within a range of a following equation (1):

$$0.5706(T/\lambda)^2 - 0.3867 T/\lambda + 0.0913 \leq t/\lambda \leq T/\lambda - 0.1 \quad \text{equation (1).}$$

5. The acoustic wave element according to claim 3, wherein
the first film contains $TaSi_2$ as a major component, and
the normalized thickness $t/\lambda$ of the first film is within a range of a following equation (2):

$$0.3995(T/\lambda)^2 - 0.2675 T/\lambda + 0.0657 \leq t/\lambda \leq T/\lambda - 0.1 \quad \text{equation (2).}$$

6. The acoustic wave element according to claim 3, wherein
the first film contains $W_5Si_2$ as a major component, and
the normalized thickness $t/\lambda$ of the first film is within a range of a following equation (3):

$$0.2978(T/\lambda)^2 - 0.1966 T/\lambda + 0.0433 \leq t/\lambda \leq T/\lambda - 0.1 \quad \text{equation (3).}$$

7. The acoustic wave element according to claim 1, wherein the first film contains an insulation material as a major component.

8. The acoustic wave element according to claim 7, further comprising a second film located on the portion in the upper surface of the piezoelectric substrate which is exposed from the electrode, the second film composed of the same material as the first film.

9. An acoustic wave device, comprising:
the acoustic wave element according to claim 1, and
a circuit board to which the acoustic wave element is attached.

10. An acoustic wave element comprising:
a piezoelectric substrate;
an electrode which is located on an upper surface of the piezoelectric substrate and which contains Al as a major component;
a first film which is located on an upper surface of the electrode; and
an insulation layer which covers the first film and a portion of the piezoelectric substrate which is exposed from the electrode, which has a thickness from the upper surface of the piezoelectric substrate which is larger than a total thickness of the electrode and the first film, and which contains a silicon oxide as a major component, wherein the first film contains as a major component a material which has a larger acoustic impedance than a material of the electrode and a material of the insulation layer and which has a slower propagation velocity of an acoustic wave than the material of the electrode and the material of the insulation layer, wherein the electrode comprising
a first bus bar and a second bus bar which face each other in a direction which crosses a propagation direction of the acoustic wave,
a plurality of first electrode fingers which extend from the first bus bar toward the second bus bar,
a plurality of second electrode fingers which extend from the second bus bar toward the first bus bar and cross the plurality of first electrode fingers,
a plurality of first dummy electrodes which extend from the first bus bar toward the second bus bar and have ends facing the ends of the plurality of second electrode fingers through first end gap portion, and
a plurality of second dummy electrodes which extend from the second bus bar toward the first bus bar and have ends facing the ends of the plurality of first electrode fingers through second end gap portions, and the acoustic wave element further comprising a plurality of second films which are located on the plurality of first end gap portions and the plurality of second end gap portions on the upper surface of the piezoelectric substrate, and contains an insulating material as a major component which has a larger acoustic impedance than the material of the electrode and the material of the insulation layer and which has a slower propagation velocity of the acoustic wave than the material of the electrode and the material of the insulation layer.

11. An acoustic wave element comprising:
a piezoelectric substrate;
an electrode which is located on an upper surface of the piezoelectric substrate and which contains Al as a major component;
a first film which is located on an upper surface of the electrode; and
an insulation layer which covers the first film and a portion of the piezoelectric substrate which is exposed from the electrode, which has a thickness from the upper surface of the piezoelectric substrate which is larger than a total thickness of the electrode and the first film, and which contains a silicon oxide as a major component, wherein the first film contains as a major component a material which has a larger acoustic impedance than a material of the electrode and a material of the insulation layer and which has a slower propagation velocity of an acoustic wave than the material of the electrode and the material of the insulation layer, wherein the first film contains an insulation material as a major component, wherein the electrode comprising
a first bus bar and a second bus bar which face each other in a direction which crosses a propagation direction of the acoustic wave,
a plurality of first electrode fingers which extend from the first bus bar toward the second bus bar, a plurality of second electrode fingers which extend from the second bus bar toward the first bus bar and cross the plurality of first electrode fingers, a plurality of first dummy electrodes which extend from the first bus bar toward the second bus bar and have ends facing the ends of the plurality of second electrode fingers through first end gap portions, and a plurality of second dummy electrodes which extend from the second bus bar toward the first bus bar and have ends facing the ends of the plurality of first electrode fingers through second end gap portions, and the acoustic wave element further comprising a second film which is located on the plurality of first end gap portions and the plurality of second end gap portions on the upper surface of the piezoelectric substrate and is composed of the same material as the first film.

* * * * *